US012136618B2

(12) United States Patent
Zhang et al.

(10) Patent No.: US 12,136,618 B2
(45) Date of Patent: *Nov. 5, 2024

(54) THREE-DIMENSIONAL MEMORY DEVICE WITH BACKSIDE SOURCE CONTACT

(71) Applicant: YANGTZE MEMORY TECHNOLOGIES CO., LTD., Wuhan (CN)

(72) Inventors: Kun Zhang, Wuhan (CN); Linchun Wu, Wuhan (CN); Wenxi Zhou, Wuhan (CN); Zhiliang Xia, Wuhan (CN); Zongliang Huo, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/858,695

(22) Filed: Jul. 6, 2022

(65) Prior Publication Data

US 2022/0336436 A1  Oct. 20, 2022

Related U.S. Application Data

(63) Continuation of application No. 16/881,294, filed on May 22, 2020, now Pat. No. 11,456,290, which is a
(Continued)

(51) Int. Cl.
*H01L 25/18* (2023.01)
*H01L 23/00* (2006.01)
(Continued)

(52) U.S. Cl.
CPC ............. *H01L 25/18* (2013.01); *H01L 24/08* (2013.01); *H01L 24/80* (2013.01);
(Continued)

(58) Field of Classification Search
CPC ..... H01L 25/18; H01L 24/08; H01L 25/0657; H01L 2224/08145; H01L 2924/1431;
(Continued)

(56) References Cited

U.S. PATENT DOCUMENTS 9,224,752 B1  12/2015  Lee et al.
10,510,415 B1  12/2019  Huo et al.
(Continued)

FOREIGN PATENT DOCUMENTS

CN  107425005 A  12/2017
CN  109037227 A  12/2018
(Continued)

OTHER PUBLICATIONS

Supplemental European Search Report issued in corresponding EP Appln. No. 20931152.1, dated Dec. 18, 2023, 8 pages.

*Primary Examiner* — Thanh Y. Tran
(74) *Attorney, Agent, or Firm* — BAYES PLLC

(57) ABSTRACT

Embodiments of 3D memory devices and methods for forming the same are disclosed. In an example, a 3D memory device includes a memory stack comprising interleaved conductive layers and dielectric layers, a plurality of semiconductor layers contacted with each other and located adjacent to the memory stack, a plurality of channel structures each extending vertically through the memory stack and at least one of the semiconductor layers, a source contact in contact with at least one of the semiconductor layers, and a contact pad located on one side of the semiconductor layers that are away from the memory stack.

20 Claims, 14 Drawing Sheets

Related U.S. Application Data continuation of application No. PCT/CN2020/084600, filed on Apr. 14, 2020.

(51) Int. Cl.
  *H01L 25/00* (2006.01)
  *H01L 25/065* (2023.01)

(52) U.S. Cl.
  CPC .......... *H01L 25/0657* (2013.01); *H01L 25/50* (2013.01); *H01L 2224/08145* (2013.01); *H01L 2224/80895* (2013.01); *H01L 2224/80896* (2013.01); *H01L 2225/06524* (2013.01); *H01L 2924/1431* (2013.01); *H01L 2924/14511* (2013.01)

(58) Field of Classification Search
  CPC ......... H01L 27/11573; H01L 27/11575; H01L 27/1157; H01L 27/11524; H01L 27/11556; H01L 24/80; H01L 27/0688; H01L 2225/06524; H01L 2924/14511
  See application file for complete search history.

(56) References Cited

U.S. PATENT DOCUMENTS

| | | | |
|---|---|---|---|
| 11,456,290 B2* | 9/2022 | Zhang | .................. H10B 43/27 |
| 2013/0234101 A1 | 9/2013 | Sasago et al. | |
| 2015/0102282 A1 | 4/2015 | Zhang et al. | |
| 2015/0357413 A1 | 12/2015 | Zhang et al. | |
| 2016/0079164 A1 | 3/2016 | Fukuzumi et al. | |
| 2016/0181264 A1 | 6/2016 | Miyamoto et al. | |
| 2017/0148811 A1 | 5/2017 | Zhang et al. | |
| 2017/0213843 A1 | 7/2017 | Choi | |
| 2017/0373087 A1 | 12/2017 | Ito et al. | |
| 2019/0081069 A1* | 3/2019 | Lu | .......................... H10B 43/27 |
| 2019/0088589 A1 | 3/2019 | Zhu et al. | |
| 2019/0115362 A1* | 4/2019 | Choi | ..................... H10B 43/50 |
| 2019/0157294 A1 | 5/2019 | Kanamori et al. | |
| 2021/0035965 A1 | 2/2021 | Mizutani et al. | |

FOREIGN PATENT DOCUMENTS

| | | |
|---|---|---|
| CN | 109148472 A | 1/2019 |
| CN | 109417073 A | 3/2019 |
| CN | 109686739 A | 4/2019 |
| CN | 109742081 A | 5/2019 |
| CN | 109786387 A | 5/2019 |
| CN | 109817633 A | 5/2019 |
| CN | 109860197 A | 6/2019 |
| CN | 110246846 A | 9/2019 |
| CN | 110494979 A | 11/2019 |
| CN | 111384062 A | 7/2020 |
| CN | 113707665 A | 11/2021 |
| EP | 3486951 A1 | 5/2019 |
| JP | 2017504217 A | 2/2017 |
| JP | 201996880 A | 6/2019 |
| JP | 2019096880 A | 6/2019 |
| TW | 201039409 A | 11/2010 |
| TW | 201039476 A | 11/2010 |
| WO | 2019037403 A1 | 2/2019 |
| WO | 2020000318 A1 | 1/2020 |

* cited by examiner

THREE-DIMENSIONAL MEMORY DEVICE WITH BACKSIDE SOURCE CONTACT

CROSS-REFERENCE TO RELATED APPLICATIONS

This application is a continuation of U.S. patent application Ser. No. 16/881,294, filed on May 22, 2020, entitled "THREE-DIMENSIONAL MEMORY DEVICE WITH BACKSIDE SOURCE CONTACT," issued as U.S. Pat. No. 11,456,290, which is a continuation of International Application No. PCT/CN2020/084600, filed on Apr. 14, 2020, entitled "THREE-DIMENSIONAL MEMORY DEVICE WITH BACKSIDE SOURCE CONTACT," both of which are hereby incorporated by references in their entireties. This application is also related to U.S. application Ser. No. 16/881,324, filed on May 22, 2020, entitled "METHOD FOR FORMING THREE-DIMENSIONAL MEMORY DEVICE WITH BACKSIDE SOURCE CONTACT," issued as U.S. Pat. No. 11,626,416, which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and methods for forming the same are disclosed herein.

In one example, a 3D memory device includes a substrate, a peripheral circuit on the substrate, a memory stack including interleaved conductive layers and dielectric layers above the peripheral circuit, a first semiconductor layer above the memory stack, a second semiconductor layer above and in contact with the first semiconductor layer, a plurality of channel structures each extending vertically through the memory stack and the first semiconductor layer, and a source contact above the memory stack and in contact with the second semiconductor layer.

In another example, a 3D memory device includes a substrate, a memory stack including interleaved conductive layers and dielectric layers above the substrate, an N-type doped semiconductor layer above the memory stack, a plurality of channel structures each extending vertically through the memory stack into the N-type doped semiconductor layer, and a source contact above the memory stack and in contact with the N-type doped semiconductor layer.

In still another example, a 3D memory device includes a first semiconductor structure, a second semiconductor structure, and a bonding interface between the first semiconductor structure and the second semiconductor structure. The first semiconductor structure includes a peripheral circuit. The second semiconductor structure includes a memory stack including interleaved conductive layers and dielectric layers, an N-type doped semiconductor layer, a plurality of channel structures each extending vertically through the memory stack into the N-type doped semiconductor layer and electrically connected to the peripheral circuit, and an insulating structure extending vertically through the memory stack and extending laterally to separate the plurality of channel structures into a plurality of blocks.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
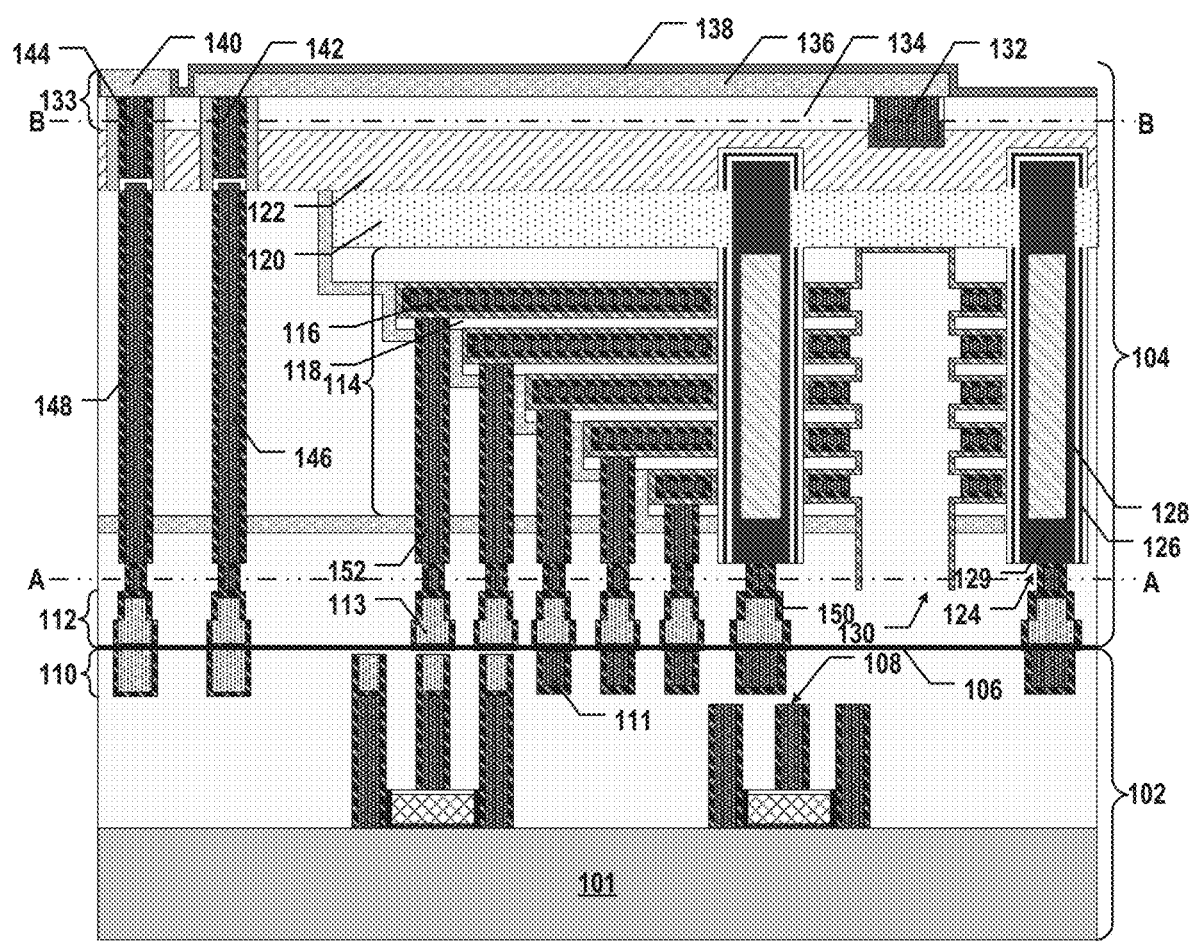
FIG. 1 illustrates a side view of a cross-section of an exemplary 3D memory device with a backside source contact, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or vertical interconnect access (via) contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, such as 3D NAND memory devices, slit structures (e.g., gate line slits (GLSs)) are used for providing electrical connections to the source of the memory array, such as array common source (ACS), from the front side of the devices. The front side source contacts, however, can affect the electrical performance of the 3D memory devices by introducing both leakage current and parasitic capacitance between the word lines and the source contacts, even with the presence of spacers in between. The formation of the spacers also complicates the fabrication process. Besides affecting the electrical performance, the slit structures usually include wall-shaped polysilicon and/or metal fillings, which can introduce local stress to cause wafer bow or warp, thereby reducing the production yield.

Moreover, some 3D NAND memory devices include semiconductor plugs selectively grown at the bottom of the channel structures. However, as the number of levels of 3D NAND memory devices increases, in particular, with multi-deck architecture, various issues are involved in the fabrication of the bottom semiconductor plugs, such as overlay control, epitaxial layer formation, and etching of memory film and semiconductor channel at the bottom of the channel holes (also known as "SONO punch"), which further complicates the fabrication process and may reduce the yield.

Various embodiments in accordance with the present disclosure provide 3D memory devices with backside source contacts. By moving the source contacts from the front side to the backside, the cost per memory cell can be reduced as the effective memory cell array area can be increased and the spacers formation process can be skipped. The device performance can be improved as well, for example, by avoiding the leakage current and parasitic capacitance between the word lines and the source contacts and by reducing the local stress caused by the front side slit structures (as source contacts). In some embodiments, the 3D memory devices do not include semiconductor plugs selectively grown at the bottom of the channel structures, which are replaced by semiconductor layers (e.g., N-wells) surrounding the sidewalls of the channel structures, which can enable gate-induce-drain-leakage (GIDL)-assisted body biasing for erase operations. As a result, various issues associated with the bottom semiconductor plugs can be avoided, such as overlay control, epitaxial layer formation, and SONO punch, thereby increasing the production yield.

FIG. 1 illustrates a side view of a cross-section of an exemplary 3D memory device 100 with a backside source contact, according to some embodiments of the present disclosure. In some embodiments, 3D memory device 100 is a bonded chip including a first semiconductor structure 102 and a second semiconductor structure 104 stacked over first semiconductor structure 102. First and second semiconductor structures 102 and 104 are jointed at a bonding interface 106 therebetween, according to some embodiments. As shown in FIG. 1, first semiconductor structure 102 can include a substrate 101, which can include silicon (e.g., single crystalline silicon, c-Si), silicon germanium (SiGe), gallium arsenide (GaAs), germanium (Ge), silicon on insulator (SOI), or any other suitable materials.

First semiconductor structure 102 of 3D memory device 100 can include peripheral circuits 108 on substrate 101. It is noted that x-, y-, and z-axes are included in FIG. 1 to illustrate the spatial relationships of the components in 3D memory device 100. Substrate 101 includes two lateral surfaces extending laterally in the x-y plane: a front surface on the front side of the wafer, and a back surface on the backside opposite to the front side of the wafer. The x- and y-directions are two orthogonal directions in the wafer plane: x-direction is the word line direction, and the y-direction is the bit line direction. The z-axis is perpendicular to both the x- and y-axes. As used herein, whether one component (e.g., a layer or a device) is "on," "above," or "below" another component (e.g., a layer or a device) of a semiconductor device (e.g., 3D memory device 100) is determined relative to the substrate of the semiconductor device (e.g., substrate 101) in the z-direction (the vertical direction perpendicular to the x-y plane) when the substrate is positioned in the lowest plane of the semiconductor device in the z-direction. The same notion for describing spatial relationships is applied throughout the present disclosure.

In some embodiments, peripheral circuit 108 is configured to control and sense the 3D memory device 100. Peripheral circuit 108 can be any suitable digital, analog, and/or mixed-signal control and sensing circuits used for facilitating the operation of 3D memory device 100 including, but not limited to, a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors). Peripheral circuits 108 can include transistors formed "on" substrate 101, in which the entirety or part of the transistors are formed in substrate 101 (e.g., below the top surface of substrate 101) and/or directly on substrate 101. Isolation regions (e.g., shallow trench isolations (STIs)) and doped regions (e.g., source regions and drain regions of the transistors) can be formed in substrate 101 as well. The transistors are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, etc.), according to some embodiments. It is understood that in some embodiments, peripheral circuit 108 may further include any other circuits compatible with the advanced logic processes including logic circuits, such as processors and programmable logic devices (PLDs), or memory circuits, such as static random-access memory (SRAM).

In some embodiments, first semiconductor structure 102 of 3D memory device 100 further includes an interconnect layer (not shown) above peripheral circuits 108 to transfer electrical signals to and from peripheral circuits 108. The interconnect layer can include a plurality of interconnects (also referred to herein as "contacts"), including lateral interconnect lines and vertical interconnect access (VIA) contacts. As used herein, the term "interconnects" can broadly include any suitable types of interconnects, such as middle-end-of-line (MEOL) interconnects and back-end-of-line (BEOL) interconnects. The interconnect layer can further include one or more interlayer dielectric (ILD) layers (also known as "intermetal dielectric (IMD) layers") in which the interconnect lines and VIA contacts can form. That is, the interconnect layer can include interconnect lines and VIA contacts in multiple ILD layers. The interconnect lines and VIA contacts in the interconnect layer can include conductive materials including, but not limited to, tungsten (W), cobalt (Co), copper (Cu), aluminum (Al), silicides, or any combination thereof. The ILD layers in the interconnect layer can include dielectric materials including, but not limited to, silicon oxide, silicon nitride, silicon oxynitride, low dielectric constant (low-k) dielectrics, or any combination thereof.

As shown in FIG. 1, first semiconductor structure 102 of 3D memory device 100 can further include a bonding layer 110 at bonding interface 106 and above the interconnect layer and peripheral circuits 108. Bonding layer 110 can include a plurality of bonding contacts 111 and dielectrics electrically isolating bonding contacts 111. Bonding contacts 111 can include conductive materials including, but not limited to, W, Co, Cu, Al, silicides, or any combination thereof. The remaining area of bonding layer 110 can be formed with dielectrics including, but not limited to, silicon oxide, silicon nitride, silicon oxynitride, low-k dielectrics, or any combination thereof. Bonding contacts 111 and surrounding dielectrics in bonding layer 110 can be used for hybrid bonding.

Similarly, as shown in FIG. 1, second semiconductor structure 104 of 3D memory device 100 can also include a bonding layer 112 at bonding interface 106 and above bonding layer 110 of first semiconductor structure 102. Bonding layer 112 can include a plurality of bonding contacts 113 and dielectrics electrically isolating bonding contacts 113. Bonding contacts 113 can include conductive materials including, but not limited to, W, Co, Cu, Al, silicides, or any combination thereof. The remaining area of bonding layer 112 can be formed with dielectrics including, but not limited to, silicon oxide, silicon nitride, silicon oxynitride, low-k dielectrics, or any combination thereof. Bonding contacts 113 and surrounding dielectrics in bonding layer 112 can be used for hybrid bonding. Bonding contacts 113 are in contact with bonding contacts 111 at bonding interface 106, according to some embodiments.

As described below in detail, second semiconductor structure 104 can be bonded on top of first semiconductor structure 102 in a face-to-face manner at bonding interface 106. In some embodiments, bonding interface 106 is disposed between bonding layers 110 and 112 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some embodiments, bonding interface 106 is the place at which bonding layers 112 and 110 are met and bonded. In practice, bonding interface 106 can be a layer with a certain thickness that includes the top surface of bonding layer 110 of first semiconductor structure 102 and the bottom surface of bonding layer 112 of second semiconductor structure 104.

In some embodiments, second semiconductor structure 104 of 3D memory device 100 further includes an interconnect layer (not shown) above bonding layer 112 to transfer electrical signals. The interconnect layer can include a plurality of interconnects, such as MEOL interconnects and BEOL interconnects. The interconnect layer can further include one or more ILD layers in which the interconnect lines and VIA contacts can form. The interconnect lines and VIA contacts in the interconnect layer can include conductive materials including, but not limited to W, Co, Cu, Al, silicides, or any combination thereof. The ILD layers in the interconnect layer can include dielectric materials including, but not limited to, silicon oxide, silicon nitride, silicon oxynitride, low-k dielectrics, or any combination thereof.

In some embodiments, 3D memory device 100 is a NAND Flash memory device in which memory cells are provided in the form of an array of NAND memory strings. As shown in FIG. 1, second semiconductor structure 104 of 3D memory device 100 can include an array of channel structures 124 functioning as the array of NAND memory strings. As shown in FIG. 1, each channel structure 124 can extend vertically through a plurality of pairs each including a conductive layer 116 and a dielectric layer 118. The interleaved conductive layers 116 and dielectric layers 118 are part of a memory stack 114. The number of the pairs of conductive layers 116 and dielectric layers 118 in memory stack 114 (e.g., 32, 64, 96, 128, 160, 192, 224, 256, or more) determines the number of memory cells in 3D memory device 100. It is understood that in some embodiments, memory stack 114 may have a multi-deck architecture (not shown), which includes a plurality of memory decks stacked over one another. The numbers of the pairs of conductive layers 116 and dielectric layers 118 in each memory deck can be the same or different.

Memory stack 114 can include a plurality of interleaved conductive layers 116 and dielectric layers 118. Conductive layers 116 and dielectric layers 118 in memory stack 114 can alternate in the vertical direction. In other words, except the ones at the top or bottom of memory stack 114, each conductive layer 116 can be adjoined by two dielectric layers 118 on both sides, and each dielectric layer 118 can be adjoined by two conductive layers 116 on both sides. Conductive layers 116 can include conductive materials including, but not limited to, W, Co, Cu, Al, polysilicon, doped silicon, silicides, or any combination thereof. Each conductive layer 116 can include a gate electrode (gate line) surrounded by an adhesive layer and a gate dielectric layer. The gate electrode of conductive layer 116 can extend laterally as a word line, ending at one or more staircase structures of memory stack 114. Dielectric layers 118 can include dielectric materials including, but not limited to, silicon oxide, silicon nitride, silicon oxynitride, or any combination thereof As shown in FIG. 1, second semiconductor structure 104 of 3D memory device 100 can also include a first semiconductor layer 120 above memory stack 114 and a second semiconductor layer 122 above and in contact with first semiconductor layer 120. In some embodiments, each of first and second semiconductor layers 120 and 122 is an N-type doped semiconductor layer, e.g., a silicon layer doped with N-type dopant(s), such as phosphorus (P) or arsenic (As). In those cases, first and second semiconductor layers 120 and 122 may be viewed collectively as an N-type doped semiconductor layer 120/122 above memory stack 114. In some embodiments, each of first and second semiconductor layers 120 and 122 includes an N-well. That is, each of first and second semiconductor layers 120 and 122 can be a region in a P-type substrate that is doped with N-type dopant(s), such as P or As. It is understood that the doping concentrations in first and second semiconductor layers 120 and 122 may be the same or different. First semiconductor layer 120 includes polysilicon, for example, N-type doped polysilicon, according to some embodiments. As described below in detail, first semiconductor layer 120 can be formed above a P-type silicon substrate by thin film deposition and/or epitaxial growth. In contrast, second semiconductor layer 122 includes single crystalline silicon, for example, N-type doped single crystalline silicon, according to some embodiments. As described below in detail, second semiconductor layer 122 can be formed by implanting N-type dopant(s) into a P-type silicon substrate having single crystalline silicon. In some embodiments, the lateral dimension of second semiconductor layer 122 in the x-direction (e.g., the word line direction) is greater than the lateral dimension of first semiconductor layer 120 in the x-direction.

In some embodiments, each channel structure 124 includes a channel hole filled with a semiconductor layer (e.g., as a semiconductor channel 128) and a composite dielectric layer (e.g., as a memory film 126). In some embodiments, semiconductor channel 128 includes silicon, such as amorphous silicon, polysilicon, or single crystalline silicon. In some embodiments, memory film 126 is a composite layer including a tunneling layer, a storage layer (also known as a "charge trap layer"), and a blocking layer. The remaining space of channel structure 124 can be partially or fully filled with a capping layer including dielectric materials, such as silicon oxide, and/or an air gap. Channel structure 124 can have a cylinder shape (e.g., a pillar shape). The capping layer, semiconductor channel 128, the tunneling layer, storage layer, and blocking layer of memory film 126 are arranged radially from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high-k dielectrics, or any combination thereof In one example, memory film 126 can include a composite layer of silicon oxide/silicon oxynitride/silicon oxide (ONO).

In some embodiments, channel structure 124 further includes a channel plug 129 in the bottom portion (e.g., at the lower end) of channel structure 124. As used herein, the "upper end" of a component (e.g., channel structure 124) is the end farther away from substrate 101 in the z-direction, and the "lower end" of the component (e.g., channel structure 124) is the end closer to substrate 101 in the z-direction when substrate 101 is positioned in the lowest plane of 3D memory device 100. Channel plug 129 can include semiconductor materials (e.g., polysilicon). In some embodiments, channel plug 129 functions as the drain of the NAND memory string.

As shown in FIG. 1, each channel structure 124 can extend vertically through interleaved conductive layers 116 and dielectric layers 118 of memory stack 114 and first semiconductor layer 120, e.g., an N-type doped polysilicon layer. In some embodiments, first semiconductor layer 120 surrounds part of channel structure 124 and is in contact with semiconductor channel 128 including polysilicon. That is, memory film 126 is disconnected at part of channel structure 124 that abuts first semiconductor layer 120, exposing semiconductor channel 128 to be in contact with the surrounding first semiconductor layer 120, according to some embodiments. As a result, first semiconductor layer 120 surrounding and in contact with semiconductor channel 128 can work as a "sidewall semiconductor plug" of channel structure 124 to replace the "bottom semiconductor plug" as described above, which can mitigate issues such as overlay control, epitaxial layer formation, and SONO punch.

In some embodiments, each channel structure 124 can extend vertically further into second semiconductor layer 122, e.g., an N-type doped single crystalline silicon layer. That is, each channel structure 124 extends vertically through memory stack 114 into the N-type doped semiconductor layer (including first and second semiconductor layers 120 and 122), according to some embodiments. As shown in FIG. 1, the top portion (e.g., the upper end) of channel structures 124 is in second semiconductor layer 122, according to some embodiments. In some embodiments, each of first and second semiconductor layers 120 and 122 is an N-type doped semiconductor layer, e.g., an N-well, to enable GIDL-assisted body biasing for erase operations, as opposed to P-well bulk erase operations. The GIDL around the source select gate of the NAND memory string can generate hole current into the NAND memory string to raise the body potential for erase operations.

As shown in FIG. 1, second semiconductor structure 104 of 3D memory device 100 can further include insulating structures 130 each extending vertically through interleaved conductive layers 116 and dielectric layers 118 of memory stack 114. Different from channel structure 124 that extends further through first semiconductor layer 120, insulating structures 130 stops at first semiconductor layer 120, i.e., does not extend vertically into the N-type doped semiconductor layer, according to some embodiments. That is, the top surface of insulating structure 130 can be flush with the bottom surface of first semiconductor layer 120. Each insulating structure 130 can also extend laterally to separate channel structures 124 into a plurality of blocks. That is, memory stack 114 can be divided into a plurality of memory blocks by insulating structures 130, such that the array of channel structures 124 can be separated into each memory block. Different from the slit structures in existing 3D NAND memory devices described above, which include front side ACS contacts, insulating structure 130 does not include any contact therein (i.e., not functioning as the source contact) and thus, does not introduce parasitic capacitance and leakage current with conductive layers 116 (including word lines), according to some embodiments. In some embodiments, each insulating structure 130 includes an opening (e.g., a slit) filled with one or more dielectric materials, including, but not limited to, silicon oxide, silicon nitride, silicon oxynitride, or any combination thereof. In one example, each insulating structure 130 may be filled with silicon oxide.

Instead of the front side source contacts, 3D memory device 100 can include a backside source contact 132 above memory stack 114 and in contact with second semiconductor layer 122, e.g., the N-type doped semiconductor layer, as shown in FIG. 1. Source contact 132 and memory stack 114 (and insulating structure 130 therethrough) can be disposed at opposites sides of semiconductor layer 122 (a thinned substrate) and thus, viewed as a "backside" source contact. In some embodiments, source contact 132 extends further into second semiconductor layer 122 and is electrically connected to first semiconductor layer 120 and semiconductor channel 128 of channel structure 124 through second semiconductor layer 122. It is understood that the depth that source contact 132 extends into second semiconductor layer 122 may vary in different examples. In some embodiments in which second semiconductor layer 122 includes an N-well, source contact 132 is also referred to herein as an "N-well pick up." In some embodiments, source contact 132 is aligned with insulating structure 130. Source contact 132 can be laterally aligned with insulating structure 130, i.e., aligned in at least one lateral direction. In one example, source contact 132 and insulating structure 130 may be aligned in the y-direction (e.g., the bit line direction). In another example, source contact 132 and insulating structure 130 may be aligned in the x-direction (e.g., the word line direction). Source contacts 132 can include any suitable types of contacts. In some embodiments, source contacts 132 include a VIA contact. In some embodiments, source contacts 132 include a wall-shaped contact extending laterally. Source contact 132 can include one or more conductive layers, such as a metal layer (e.g., W, Co, Cu, or Al) or a silicide layer surrounded by an adhesive layer (e.g., titanium nitride (TiN)).

As shown in FIG. 1, 3D memory device 100 can further include a BEOL interconnect layer 133 above and in contact with source contact 132 for pad-out, e.g., transferring electrical signals between 3D memory device 100 and external circuits. In some embodiments, interconnect layer 133 includes one or more ILD layers 134 on second semiconductor layer 122 and a redistribution layer 136 on ILD layers 134. The upper end of source contact 132 is flush with the top surface of ILD layers 134 and the bottom surface of redistribution layer 136, and source contact 132 extends vertically through ILD layers 134 into second semiconductor layer 122, according to some embodiments. ILD layers 134 in interconnect layer 133 can include dielectric materials including, but not limited to, silicon oxide, silicon nitride, silicon oxynitride, low-k dielectrics, or any combination thereof. Redistribution layer 136 in interconnect layer 133 can include conductive materials including, but not limited to W, Co, Cu, Al, silicides, or any combination thereof. In one example, redistribution layer 136 includes Al. In some embodiments, interconnect layer 133 further includes a passivation layer 138 as the outmost layer for passivation and protection of 3D memory device 100. Part of redistribution layer 136 can be exposed from passivation layer 138 as contact pads 140. That is, interconnect layer 133 of 3D memory device 100 can also include contact pads 140 for wire bonding and/or bonding with an interposer.

In some embodiments, second semiconductor structure 104 of 3D memory device 100 further includes contacts 142 and 144 through second semiconductor layer 122. As second semiconductor layer 122 can be a thinned substrate, for example, an N-well of a P-type silicon substrate, contacts 142 and 144 are through silicon contacts (TSCs), according to some embodiments. In some embodiments, contact 142 extends through second semiconductor layer 122 and ILD layers 134 to be in contact with redistribution layer 136, such that first semiconductor layer 120 is electrically connected to contact 142 through second semiconductor layer 122, source contact 132, and redistribution layer 136 of interconnect layer 133. In some embodiments, contact 144 extends through second semiconductor layer 122 and ILD layers 134 to be in contact with contact pad 140. Contacts 142 and 144 each can include one or more conductive layers, such as a metal layer (e.g., W, Co, Cu, or Al) or a silicide layer surrounded by an adhesive layer (e.g., TiN). In some embodiments, at least contact 144 further includes a spacer (e.g., a dielectric layer) to electrically insulate contact 144 from second semiconductor layer 122.

In some embodiments, 3D memory device 100 further includes peripheral contacts 146 and 148 each extending vertically to second semiconductor layer 122 (e.g., an N-well of a P-type silicon substrate) outside of memory stack 114. Each peripheral contact 146 or 148 can have a depth greater than the depth of memory stack 114 to extend vertically from bonding layer 112 to second semiconductor layer 122 in a peripheral region that is outside of memory stack 114. In some embodiments, peripheral contact 146 is below and in contact with contact 142, such that first semiconductor layer 120 is electrically connected to peripheral circuit 108 in first semiconductor structure 102 through at least second semiconductor layer 122, source contact 132, interconnect layer 133, contact 142, and peripheral contact 146. In some embodiments, peripheral contact 148 is below and in contact with contact 144, such that peripheral circuit 108 in first semiconductor structure 102 is electrically connected to contact pad 140 for pad-out through at least contact 144 and peripheral contact 148. Peripheral contacts 146 and 148 each can include one or more conductive layers, such as a metal layer (e.g., W, Co, Cu, or Al) or a silicide layer surrounded by an adhesive layer (e.g., TiN).

As shown in FIG. 1, 3D memory device 100 also includes a variety of local contacts (also known as "C1") as part of the interconnect structure, which are in contact with a structure in memory stack 114 directly. In some embodiments, the local contacts include channel local contacts 150 each below and in contact with the lower end of a respective channel structure 124. Each channel local contact 150 can be electrically connected to a bit line contact (not shown) for bit line fan-out. In some embodiments, the local contacts further include word line local contacts 152 each below and in contact with a respective conductive layer 116 (including a word line) at the staircase structure of memory stack 114 for word line fan-out. Local contacts, such as channel local contacts 150 and word line local contacts 152, can be electrically connected to peripheral circuits 108 of first semiconductor structure 102 through at least bonding layers 112 and 110. Local contacts, such as channel local contacts 150 and word line local contacts 152, each can include one or more conductive layers, such as a metal layer (e.g., W, Co, Cu, or Al) or a silicide layer surrounded by an adhesive layer (e.g., TiN).

Figure 2A:
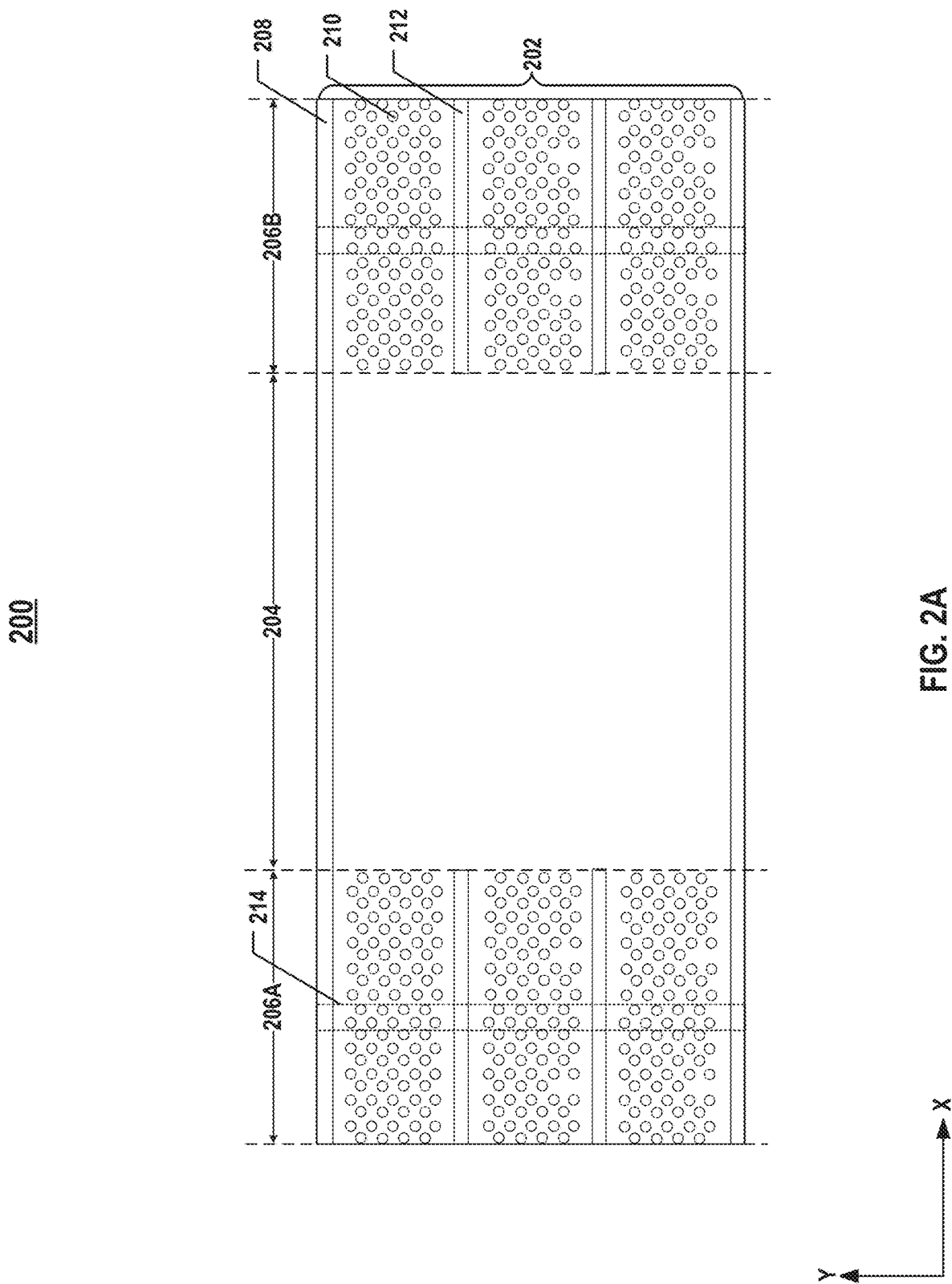
FIG. 2A illustrates a plan view of a cross-section of an exemplary 3D memory device with a backside source contact, according to some embodiments of the present disclosure.

FIG. 2A illustrates a plan view of a cross-section of an exemplary 3D memory device 200 with a backside source contact, according to some embodiments of the present disclosure. 3D memory device 200 may be one example of 3D memory device 100 in FIG. 1, and FIG. 2A may illustrate a plan view of the cross-section in the AA plane of 3D memory device 100 in FIG. 1, according to some embodiments. That is, FIG. 2A shows one example of the plan view at the front side of second semiconductor structure 104 of 3D memory device 100.

Figure 3A:
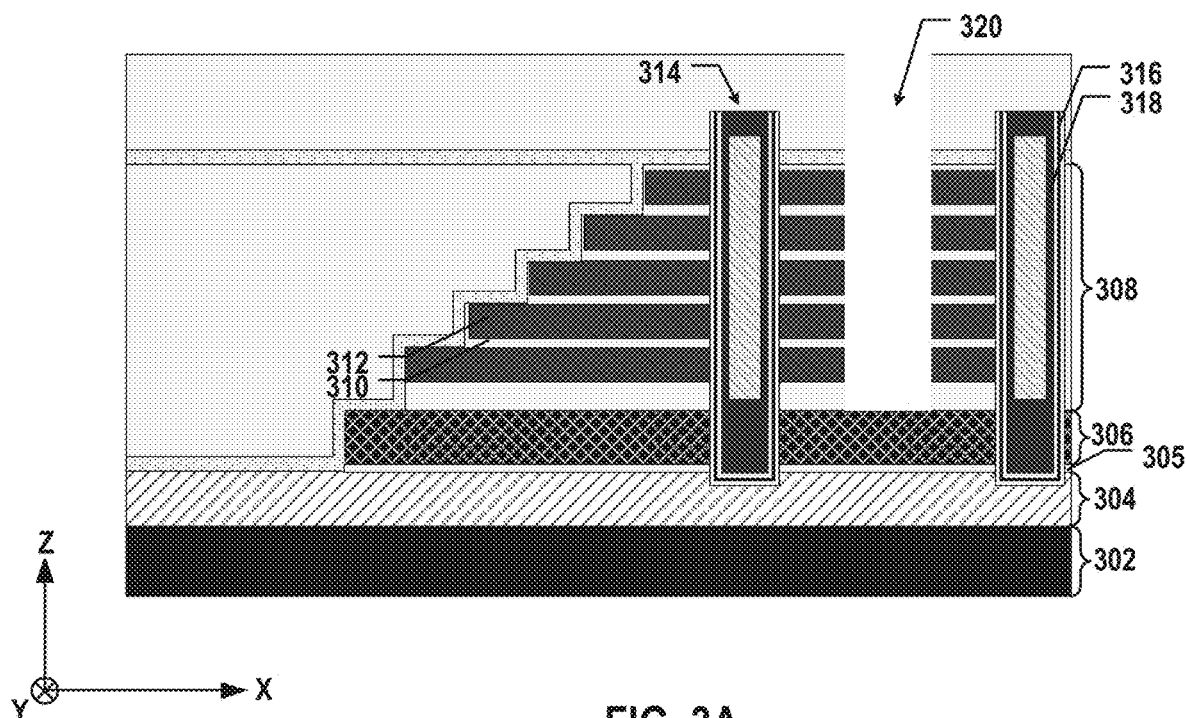
FIGS. 3A-3M illustrate a fabrication process for forming an exemplary 3D memory device with a backside source contact, according to some embodiments of the present disclosure.
Figure 3B:
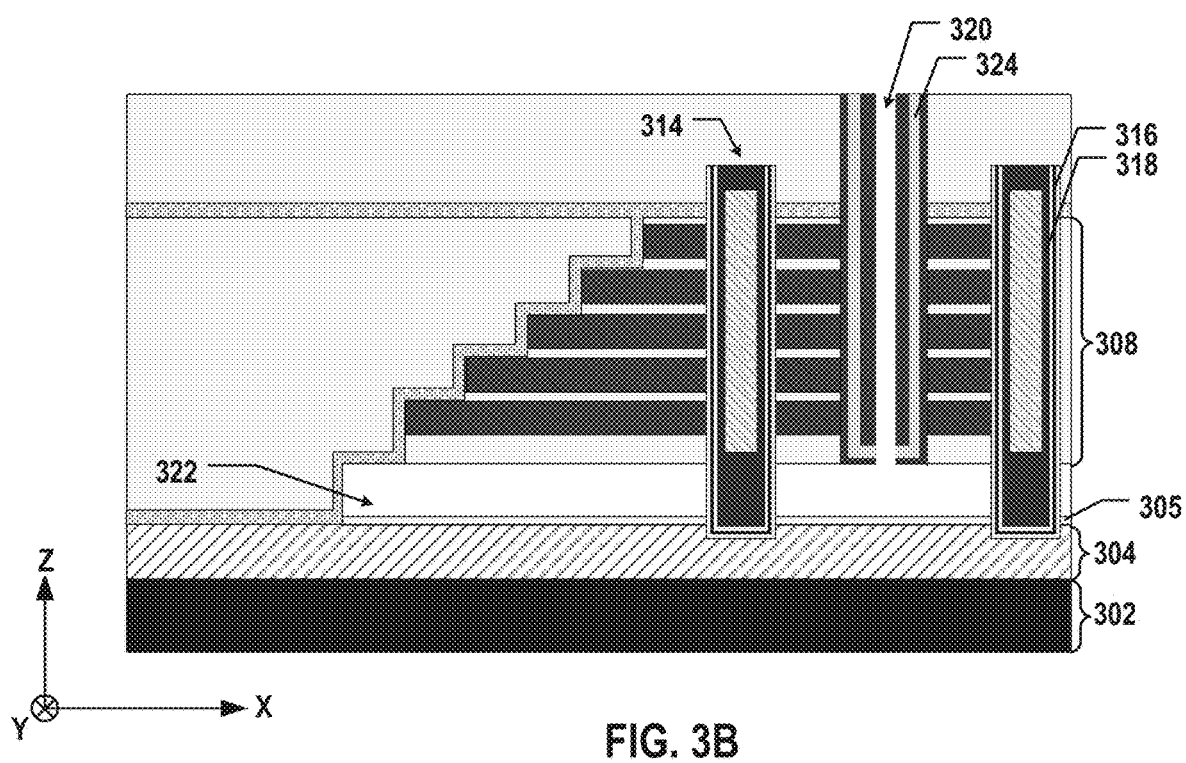
Figure 3C:
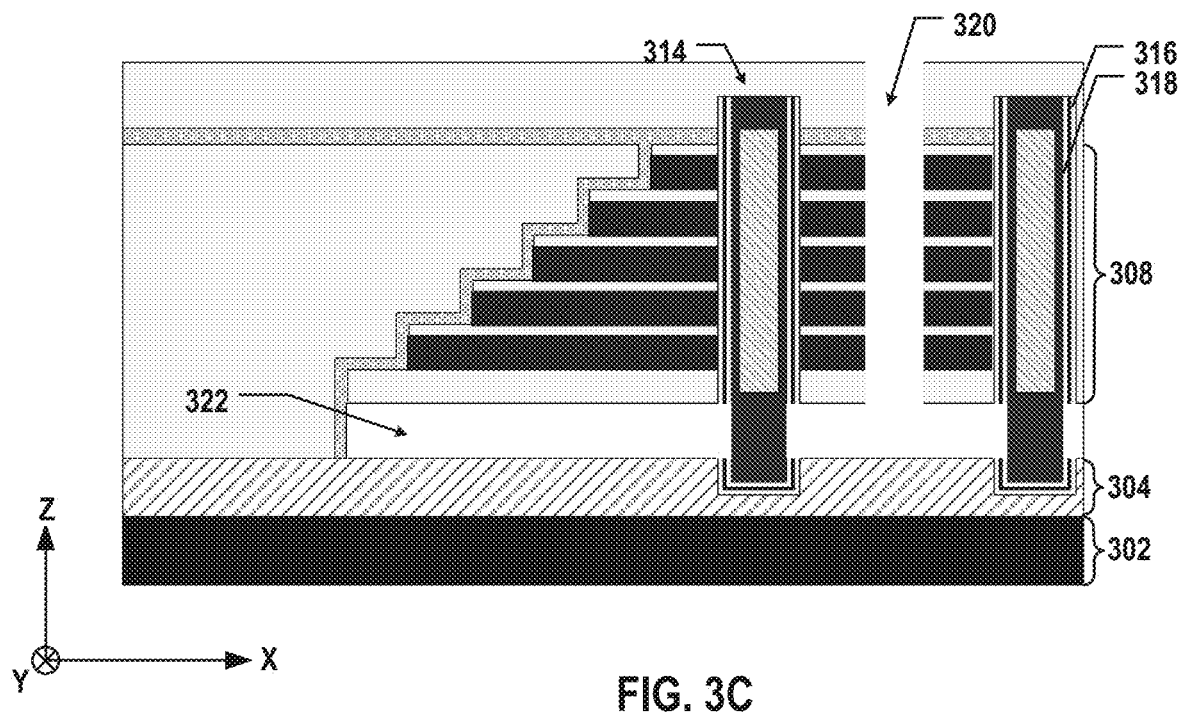
Figure 3D:
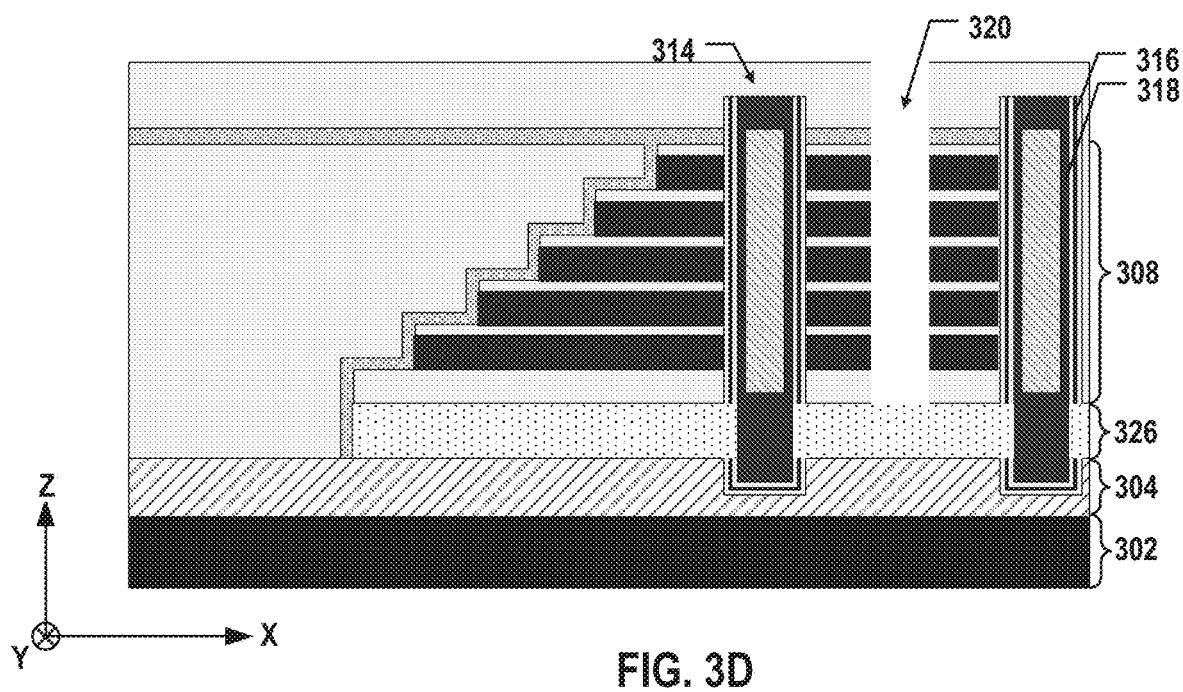

As shown in FIG. 2A, 3D memory device 200 includes a center staircase region 204 laterally separating the memory stack in the x-direction (e.g., the word line direction) into two parts: a first core array region 206A and a second core array region 206B, each of which includes an array of channel structures 210 (corresponding to channel structures 124 in FIG. 1), according to some embodiments. It is understood that the layout of the staircase region and core array regions is not limited to the example of FIG. 2A and may include any other suitable layouts, such as having side staircase regions at the edges of the memory stack. 3D memory device 200 also includes parallel insulating structures 208 (corresponding to insulating structures 130 in FIG. 1) in they-direction (e.g., the bit line direction) each extending laterally in the x-direction to separate core array regions 206A and 206 and arrays of channel structures 210 therein into blocks 202, according to some embodiments. 3D memory device 200 can further include parallel drain select gate cuts 212 in the y-direction in block 202 to further separate block 202 into fingers. Different from existing 3D memory devices with front side source contacts disposed at the counterparts of insulating structures 208 (e.g., front side ACS contacts), which interrupt the front side bit line fan-out of certain channel structures 210 (e.g., in regions 214), channel structure 210, including the ones in regions 214, in 3D memory device 200 without front side source contacts can all have corresponding bit lines fan-out from the front side. As a result, the effective area of core array regions 206A and 206B can be increased by moving the source contacts to the backside of 3D memory device 200.

Figure 2B:
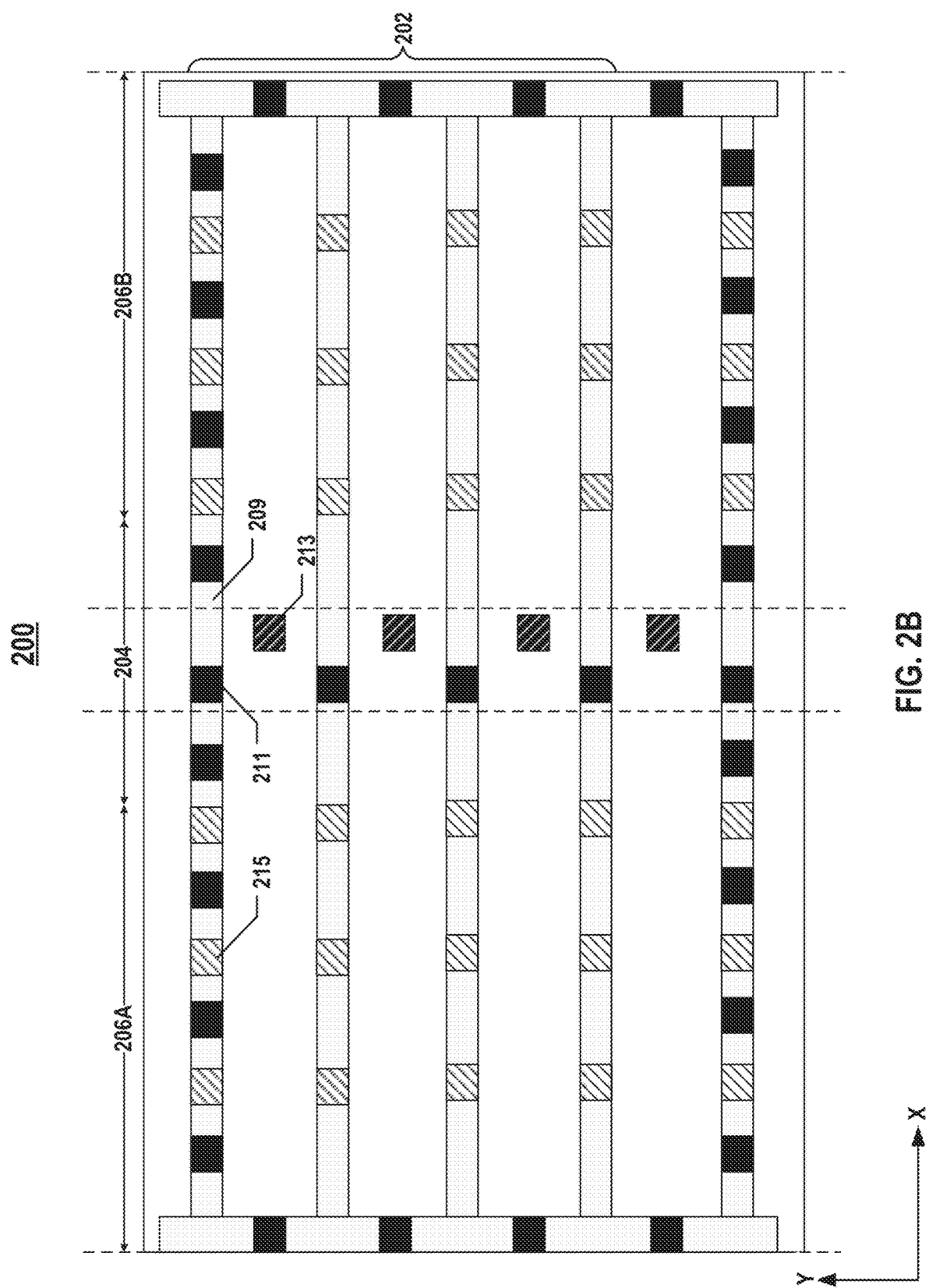
FIG. 2B illustrates another plan view of a cross-section of an exemplary 3D memory device with a backside source contact, according to some embodiments of the present disclosure.

FIG. 2B illustrates another plan view of a cross-section of an exemplary 3D memory device with a backside source contact, according to some embodiments of the present disclosure. 3D memory device 200 may be one example of 3D memory device 100 in FIG. 1, and FIG. 2B illustrates a plan view of the cross-section in the BB plane of 3D memory device 100 in FIG. 1, according to some embodiments. That is, FIG. 2B shows one example of the plan view at the backside of second semiconductor structure 104 of 3D memory device 100.

As shown in FIG. 2B, 3D memory device 200 includes center staircase region 204 laterally separating the memory stack in the x-direction (e.g., the word line direction) into two parts: first core array region 206A and second core array region 206B. It is understood that the layout of the staircase region and core array regions is not limited to the example of FIG. 2B and may include any other suitable layouts, such as having side staircase regions at the edges of the memory stack. In some embodiments, 3D memory device 200 includes backside source contacts 215 (e.g., in the form of VIA contacts, corresponding to source contacts 132 in FIG. 1) in core array regions 206A and 206B. For example, source contacts 215 may be evenly distributed in core array region 206A or 206B. 3D memory device 200 can include backside source lines 209 (e.g., in the form of a source line mesh, corresponding to redistribution layer 136 in FIG. 1) electrically connecting multiple source contacts 215. It is understood that in some examples, multiple source VIA contacts may be replaced by one or more source wall-shaped contacts, i.e., interconnect lines. In some embodiments, 3D memory device 200 further includes pad-out contacts 213 (e.g., corresponding to contact pad 140, contact 144, and peripheral contact 148 in FIG. 1) in staircase region 204 for pad-out and includes N-well pick up contacts 211 (e.g., corresponding to contact 142 and peripheral contact 146 in FIG. 1) in staircase region 204 and core array regions 206A and 206B. It is further understood that the layout of pad-out contacts 213 and N-well pick up contacts 211 is not limited to the example in FIG. 2B and may include any suitable layouts depending on the design of the 3D memory device, such as the specification (e.g., voltage and resistance) of the electrical performance. In one example, additional pad-out contacts 213 may be added outside of the memory stack.

FIGS. 3A-3M illustrate a fabrication process for forming an exemplary 3D memory device with a backside source contact, according to some embodiments of the present disclosure. FIGS. 4A and 4B illustrate a flowchart of a method 400 for forming an exemplary 3D memory device with a backside source contact, according to some embodiments of the present disclosure. Examples of the 3D memory device depicted in FIGS. 3A-3M, 4A, and 4B include 3D memory device 100 depicted in FIG. 1. FIGS. 3A-3M, 4A, and 4B will be described together. It is understood that the operations shown in method 400 are not exhaustive and that other operations can be performed as well before, after, or between any of the illustrated operations. Further, some of the operations may be performed simultaneously, or in a different order than shown in FIGS. 4A and 4B.

Referring to FIG. 4A, method 400 starts at operation 402, in which a peripheral circuit is formed on a first substrate. The first substrate can be a silicon substrate. As illustrated in FIG. 3I, a plurality of transistors are formed on a silicon substrate 350 using a plurality of processes including, but not limited to, photolithography, etching, thin film deposition, thermal growth, implantation, chemical mechanical polishing (CMP), and any other suitable processes. In some embodiments, doped regions (not shown) are formed in silicon substrate 350 by ion implantation and/or thermal diffusion, which function, for example, as source regions and/or drain regions of the transistors. In some embodiments, isolation regions (e.g., STIs) are also formed in silicon substrate 350 by wet etching and/or dry etching and thin film deposition. The transistors can form peripheral circuits 352 on silicon substrate 350.

As illustrated in FIG. 3I, a bonding layer 348 is formed above peripheral circuits 352. Bonding layer 348 includes bonding contacts electrically connected to peripheral circuits 352. To form bonding layer 348, an ILD layer is deposited using one or more thin film deposition processes, such as chemical vapor deposition (CVD), physical vapor deposition (PVD), atomic layer deposition (ALD), or any combination thereof, and the bonding contacts are formed through the ILD layer using wet etching and/or dry etching, e.g., RIE, followed by one or more thin film deposition processes, such as ALD, CVD, PVD, any other suitable processes, or any combination thereof.

Method 400 proceeds to operation 404, as illustrated in FIG. 4A, in which a portion of a second substrate is doped with an N-type dopant to form a second semiconductor layer. The second substrate can be a P-type silicon substrate. In some embodiments, the first side (e.g., the front side at which semiconductor devices are formed) of the second substrate is doped to form an N-well. As illustrated in FIG. 3A, an N-type doped semiconductor layer 304 is formed on a silicon substrate 302. N-type doped semiconductor layer 304 can include an N-well in a P-type silicon substrate 302 and include single crystalline silicon. N-type doped semiconductor layer 304 can be formed by doping N-type dopant(s), such as P or As, into P-type silicon substrate 302 using ion implantation and/or thermal diffusion.

Method 400 proceeds to operation 406, as illustrated in FIG. 4A, in which a sacrificial layer above the second semiconductor layer and a dielectric stack on the sacrificial layer are subsequently formed. The dielectric stack can include interleaved stack sacrificial layers and stack dielectric layers. In some embodiments, to subsequently form the sacrificial layer and the dielectric stack, polysilicon is deposited on the second semiconductor layer to form the sacrificial layer, and stack dielectric layers and stack sacrificial layers are alternatingly deposited on the sacrificial layer to form the dielectric stack.

As illustrated in FIG. 3A, a sacrificial layer 306 is formed on N-type doped semiconductor layer 304. Sacrificial layer 306 can be formed by depositing polysilicon or any other suitable sacrificial material (e.g., carbon) that can be later selectively removed using one or more thin film deposition processes including, but not limited to, CVD, PVD, ALD, or any combination thereof. In some embodiments, a pad oxide layer 305 is formed between sacrificial layer 306 and N-type doped semiconductor layer 304 by depositing dielectric materials, such as silicon oxide, or thermal oxidation, on silicon substrate 302 prior to the formation of N-type doped semiconductor layer 304.

As illustrated in FIG. 3A, a dielectric stack 308 including a plurality pairs of a first dielectric layer (referred to herein as "stack sacrificial layer" 312) and a second dielectric layer (referred to herein as "stack dielectric layers" 310, together referred to herein as "dielectric layer pairs") is formed on sacrificial layer 306. Dielectric stack 308 includes interleaved stack sacrificial layers 312 and stack dielectric layers 310, according to some embodiments. Stack dielectric layers 310 and stack sacrificial layers 312 can be alternatively deposited on sacrificial layer 306 above silicon substrate 302 to form dielectric stack 308. In some embodiments, each stack dielectric layer 310 includes a layer of silicon oxide, and each stack sacrificial layer 312 includes a layer of silicon nitride. Dielectric stack 308 can be formed by one or more thin film deposition processes including, but not limited to, CVD, PVD, ALD, or any combination thereof. As illustrated in FIG. 3A, a staircase structure can be formed on the edge of dielectric stack 308. The staircase structure can be formed by performing a plurality of so-called "trim-etch" cycles to the dielectric layer pairs of dielectric stack 308 toward silicon substrate 302. Due to the repeated trim-etch cycles applied to the dielectric layer pairs of dielectric stack 308, dielectric stack 308 can have one or more tilted edges and a top dielectric layer pair shorter than the bottom one, as shown in FIG. 3A.

Method 400 proceeds to operation 408, as illustrated in FIG. 4A, in which a channel structure extending vertically through the dielectric stack and the sacrificial layer into the second semiconductor layer is formed. In some embodiments, to form the channel structure, a channel hole extending vertically through the dielectric stack and the sacrificial layer into the second semiconductor layer is formed, a memory film and a semiconductor channel are subsequently formed over a sidewall of the channel hole, and a channel plug is formed above and in contact with the semiconductor channel.

As illustrated in FIG. 3A, a channel hole is an opening extending vertically through dielectric stack 308 and sacrificial layer 306 into N-type doped semiconductor layer 304. In some embodiments, a plurality of openings are formed, such that each opening becomes the location for growing an individual channel structure 314 in the later process. In some embodiments, fabrication processes for forming the channel hole of channel structure 314 include wet etching and/or dry etching, such as deep-ion reactive etching (DRIE). In some embodiments, the channel hole of channel structure 314 extends further through the top portion of N-type doped semiconductor layer 304. The etching process through dielectric stack 308 and sacrificial layer 306 may continue to etch part of N-type doped semiconductor layer 304. In some embodiments, a separate etching process is used to etch part of N-type doped semiconductor layer 304 after etching through dielectric stack 308 and sacrificial layer 306.

As illustrated in FIG. 3A, a memory film 316 (including a blocking layer, a storage layer, and a tunneling layer) and a semiconductor channel 318 are subsequently formed in this order along sidewalls and the bottom surface of the channel hole. In some embodiments, memory film 316 is first deposited along the sidewalls and bottom surface of the channel hole, and semiconductor channel 318 is then deposited over memory film 316. The blocking layer, storage layer, and tunneling layer can be subsequently deposited in this order using one or more thin film deposition processes, such as ALD, CVD, PVD, any other suitable processes, or any combination thereof, to form memory film 316. Semiconductor channel 318 can then be formed by depositing a semiconductor material, such as polysilicon, over the tunneling layer of memory film 316 using one or more thin film deposition processes, such as ALD, CVD, PVD, any other suitable processes, or any combination thereof. In some embodiments, a first silicon oxide layer, a silicon nitride layer, a second silicon oxide layer, and a polysilicon layer (a "SONO" structure) are subsequently deposited to form memory film 316 and semiconductor channel 318.

As illustrated in FIG. 3A, a capping layer is formed in the channel hole and over semiconductor channel 318 to completely or partially fill the channel hole (e.g., without or with an air gap). The capping layer can be formed by depositing a dielectric material, such as silicon oxide, using one or more thin film deposition processes, such as ALD, CVD, PVD, any other suitable processes, or any combination thereof. A channel plug then can be formed in the top portion of the channel hole. In some embodiments, parts of memory film 316, semiconductor channel 318, and the capping layer that are on the top surface of dielectric stack 308 are removed and planarized by CMP, wet etching, and/or dry etching. A recess then can be formed in the top portion of the channel hole by wet etching and/or drying etching parts of semiconductor channel 318 and the capping layer in the top portion of the channel hole. The channel plug then can be formed by depositing semiconductor materials, such as polysilicon, into the recess by one or more thin film deposition processes, such as CVD, PVD, ALD, or any combination thereof. Channel structure 314 is thereby formed through dielectric stack 308 and sacrificial layer 306 into N-type doped semiconductor layer 304.

Method 400 proceeds to operation 410, as illustrated in FIG. 4A, in which the sacrificial layer is replaced with an N-type doped semiconductor layer to form the first semiconductor layer. In some embodiments, to replace the sacrificial layer with the first semiconductor layer, an opening extending vertically through the dielectric stack is formed to expose part of the sacrificial layer, the sacrificial layer is etched through the opening to form a cavity, and N-type doped polysilicon is deposited into the cavity through the opening to form the first semiconductor layer.

As illustrated in FIG. 3A, a slit 320 is an opening that extends vertically through dielectric stack 308 and exposes part of sacrificial layer 306. In some embodiments, fabrication processes for forming slit 320 include wet etching and/or dry etching, such as DRIE. In some embodiments, slit 320 extends further into the top portion of sacrificial layer 306. The etching process through dielectric stack 308 may not stop at the top surface of sacrificial layer 306 and may continue to etch part of sacrificial layer 306.

As illustrated in FIG. 3B, sacrificial layer 306 (shown in FIG. 3A) is removed by wet etching and/or dry etching to form a cavity 322. In some embodiments, sacrificial layer 306 includes polysilicon, which can be etched by applying tetramethylammonium hydroxide (TMAH) etchant through slit 320, which can be stopped by pad oxide layer 305 between sacrificial layer 306 and N-type doped semiconductor layer 304. That is, the removal of sacrificial layer 306 does not affect N-type doped semiconductor layer 304, according to some embodiments. In some embodiments, prior to the removal of sacrificial layer 306, a spacer 324 is formed along the sidewall of slit 320. Spacer 324 can be formed by depositing dielectric materials, such as silicon nitride, silicon oxide, and silicon nitride, into slit 320 using one or more thin film deposition processes, such as CVD, PVD, ALD, or any combination thereof As illustrated in FIG. 3C, part of memory film 316 of channel structure 314 exposed in cavity 322 is removed to expose part of semiconductor channel 318 of channel structure 314 abutting cavity 322. In some embodiments, parts of the blocking layer (e.g., including silicon oxide), storage layer (e.g., including silicon nitride), and tunneling layer (e.g., including silicon oxide) are etched by applying etchants through slit 320 and cavity 322, for example, phosphoric acid for etching silicon nitride and hydrofluoric acid for etching silicon oxide. The etching can be stopped by semiconductor channel 318 of channel structure 314. Spacer 324 including dielectric materials (shown in FIG. 3B) can also protect dielectric stack 308 from the etching of memory film 316 and can be removed by the etchants in the same step as removing part of memory film 316. Similarly, pad oxide layer 305 (shown in FIG. 3B) on N-type doped semiconductor layer 304 can be removed as well by the same step as removing part of memory film 316.

As illustrated in FIG. 3D, an N-type doped semiconductor layer 326 is formed above and in contact with N-type doped semiconductor layer 304. In some embodiments, N-type doped semiconductor layer 326 is formed by depositing polysilicon into cavity 322 (shown in FIG. 3C) through slit 320 using one or more thin film deposition processes, such as CVD, PVD, ALD, or any combination thereof. In some embodiments, N-type doped semiconductor layer 326 is formed by selectively filling cavity 322 with polysilicon epitaxially grown from the exposed part of semiconductor channel 318 (including polysilicon). The fabrication processes for epitaxially growing N-type doped semiconductor layer 326 can include pre-cleaning cavity 322 followed by, for example, vapor-phase epitaxy (VPE), liquid-phase epitaxy (LPE), molecular-beam epitaxy (MBE), or any combinations thereof. In some embodiments, in-situ doping of N-type dopants, such as P or As, is performed when depositing or epitaxially growing polysilicon to form an N-type doped polysilicon layer as N-type doped semiconductor layer 326. N-type doped semiconductor layer 326 can fill cavity 322 to be in contact with the exposed part of semiconductor channel 318 of channel structure 314.

Method 400 proceeds to operation 412, as illustrated in FIG. 4A, in which the dielectric stack is replaced with a memory stack, for example, using the so-called "gate replacement" process, such that the channel structure extends vertically through the memory stack and the first semiconductor layer into the second semiconductor layer. In some embodiments, to replace the dielectric stack with the memory stack, the stack sacrificial layers are replaced with stack conductive layers through the opening. In some embodiments, the memory stack includes interleaved stack conductive layers and stack dielectric layers.

Figure 3E:
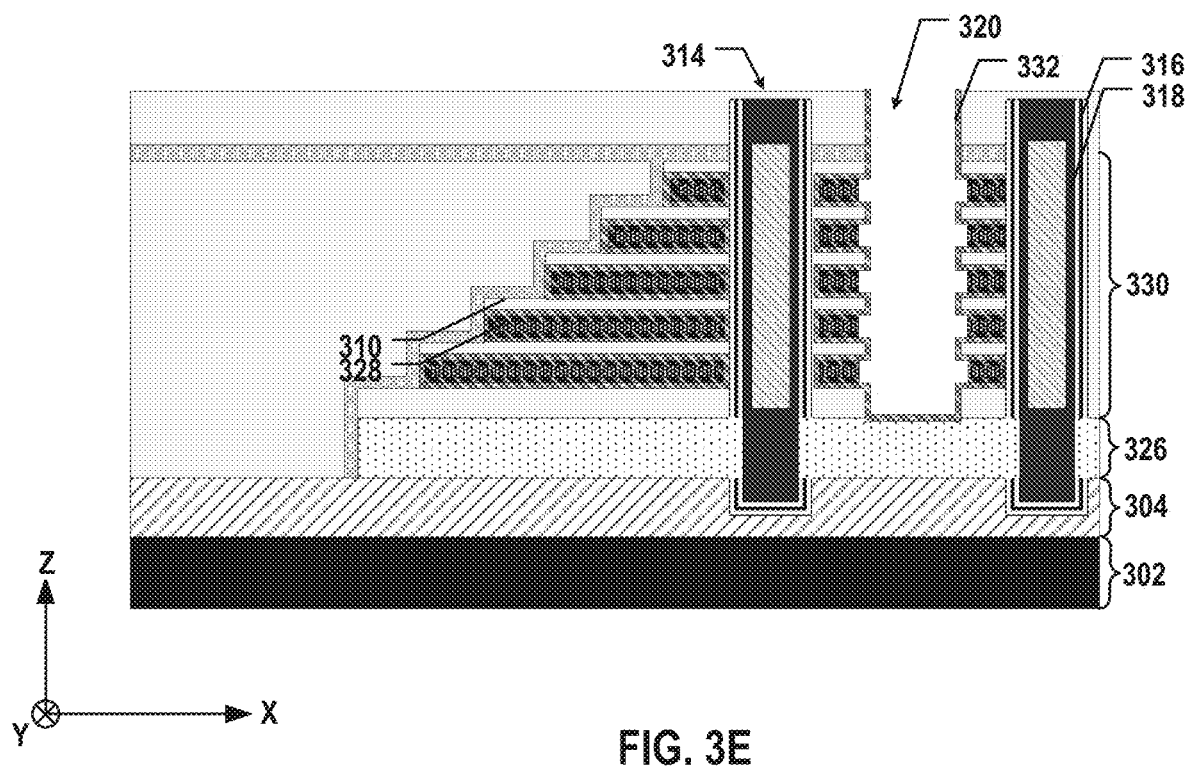
Figure 4A:
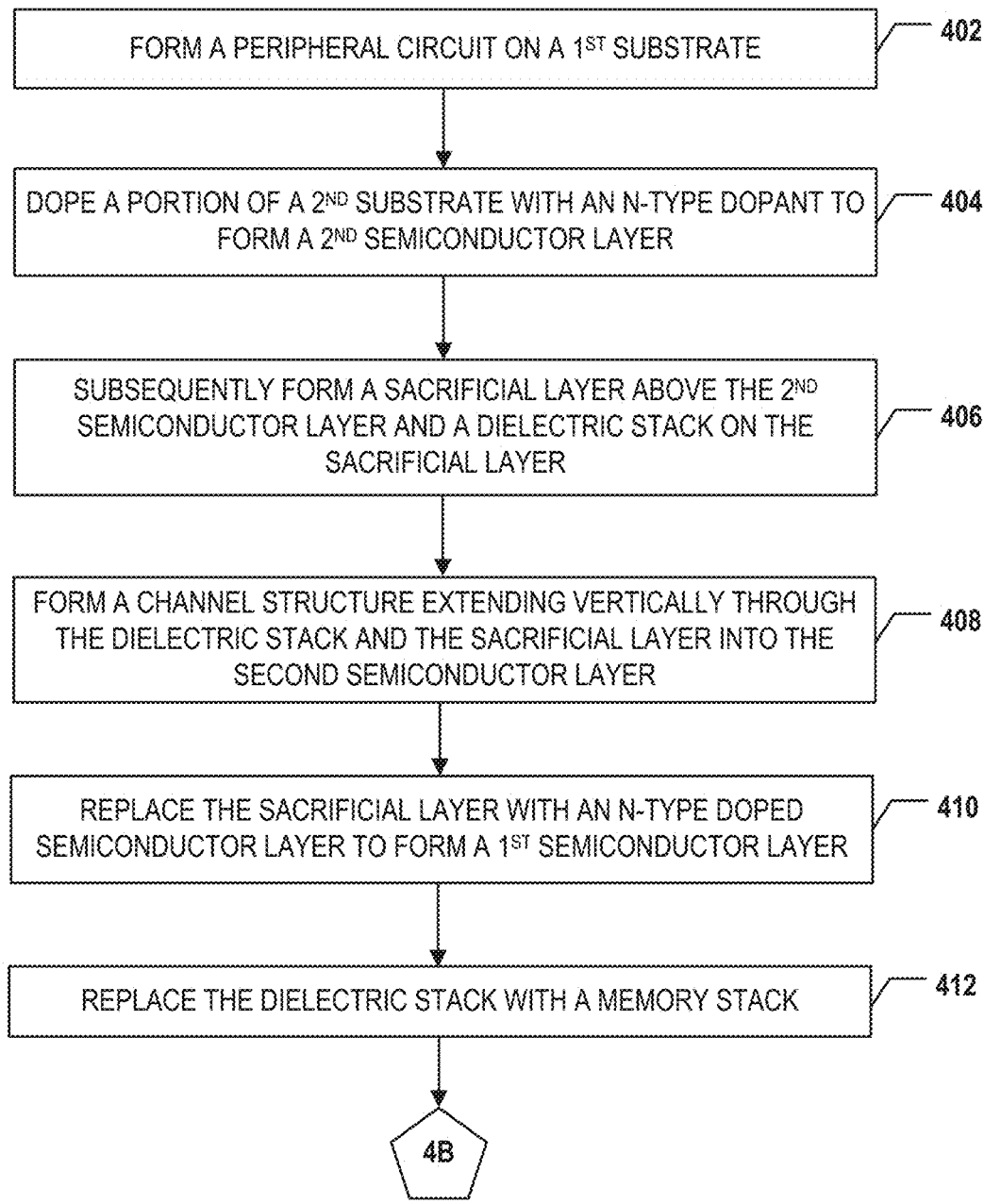
FIGS. 4A and 4B illustrate a flowchart of a method for forming an exemplary 3D memory device with a backside source contact, according to some embodiments of the present disclosure.
Figure 4B:
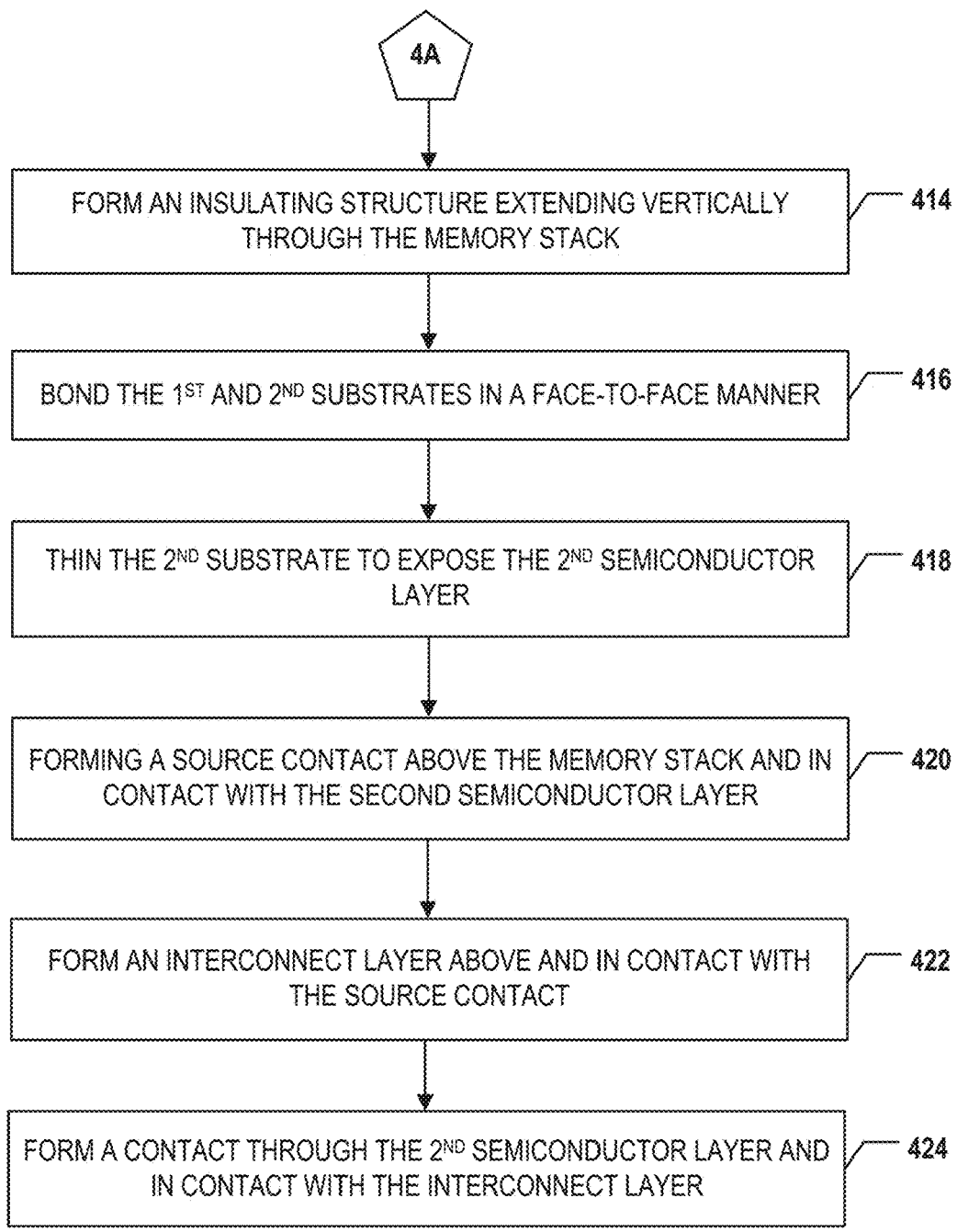

As illustrated in FIG. 3E, stack sacrificial layers 312 (shown in FIG. 3A) are replaced with stack conductive layers 328, and a memory stack 330 including interleaved stack conductive layers 328 and stack dielectric layers 310 is thereby formed, replacing dielectric stack 308 (shown in FIG. 3A). In some embodiments, lateral recesses (not shown) are first formed by removing stack sacrificial layers 312 through slit 320. In some embodiments, stack sacrificial layers 312 are removed by applying etchants through slit 320, creating the lateral recesses interleaved between stack dielectric layers 310. The etchants can include any suitable etchants that etch stack sacrificial layers 312 selective to stack dielectric layers 310. As illustrated in FIG. 3E, stack conductive layers 328 (including gate electrodes and adhesive layers) are deposited into the lateral recesses through slit 320. In some embodiments, a gate dielectric layer 332 is deposited into the lateral recesses prior to stack conductive layers 328, such that stack conductive layers 328 are deposited on the gate dielectric layer. Stack conductive layers 328, such as metal layers, can be deposited using one or more thin film deposition processes, such as ALD, CVD, PVD, any other suitable processes, or any combination thereof. In some embodiments, gate dielectric layer 332, such as a high-k dielectric layer, is formed along the sidewall and at the bottom of slit 320 as well.

Figure 3F:
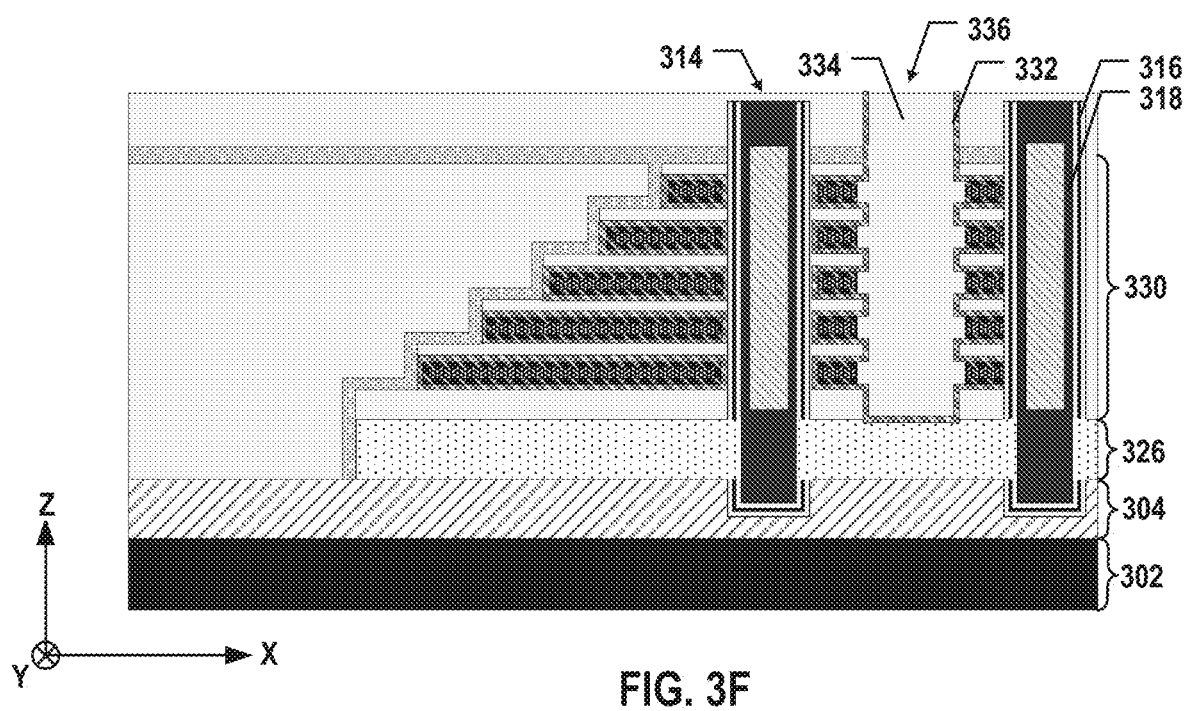

Method 400 proceeds to operation 414, as illustrated in FIG. 4B, in which an insulating structure extending vertically through the memory stack is formed. In some embodiments, to form the insulating structure, after forming the memory stack, one or more dielectric materials are deposited into the opening to fill the opening. As illustrated in FIG. 3F, an insulating structure 336 extending vertically through memory stack 330 is formed, stopping on the top surface of N-type doped semiconductor layer 326. Insulating structure 336 can be formed by depositing one or more dielectric materials, such as silicon oxide, into slit 320 to fully or partially fill slit 320 (with or without an air gap) using one or more thin film deposition processes, such as ALD, CVD, PVD, any other suitable processes, or any combination thereof. In some embodiments, insulating structure 336 includes gate dielectric layer 332 (e.g., including high-k dielectrics) and a dielectric capping layer 334 (e.g., including silicon oxide).

Figure 3G:
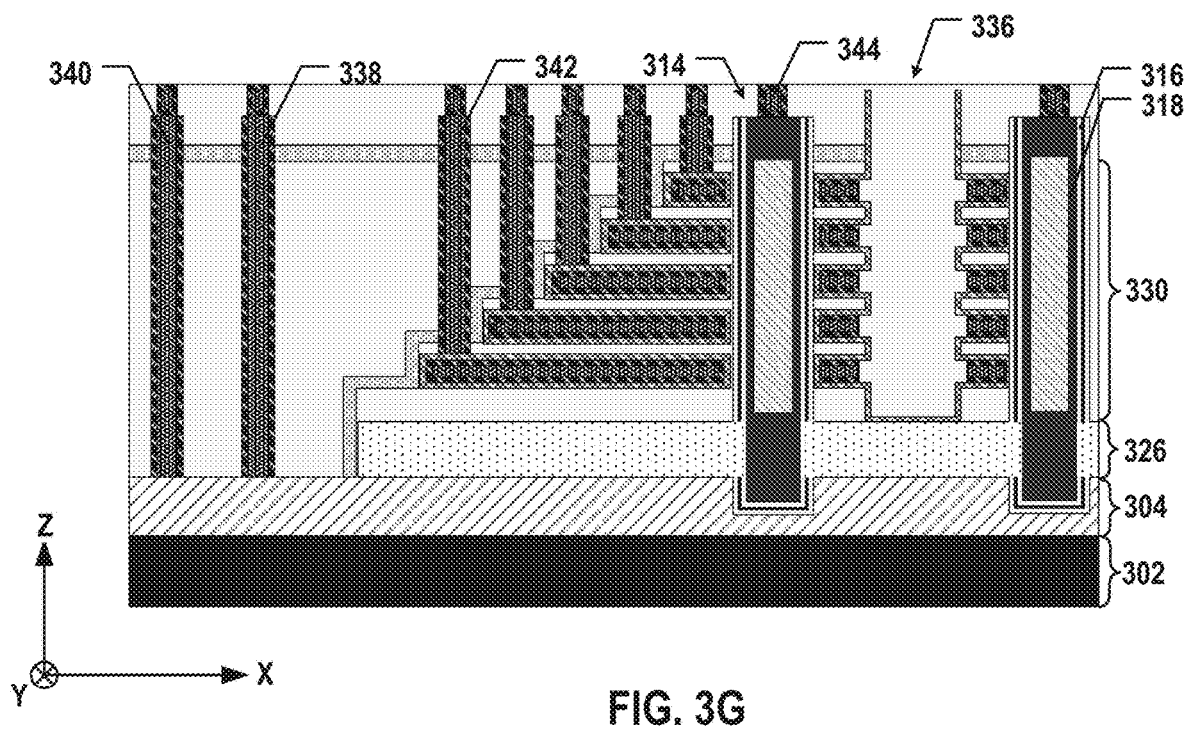
Figure 3H:
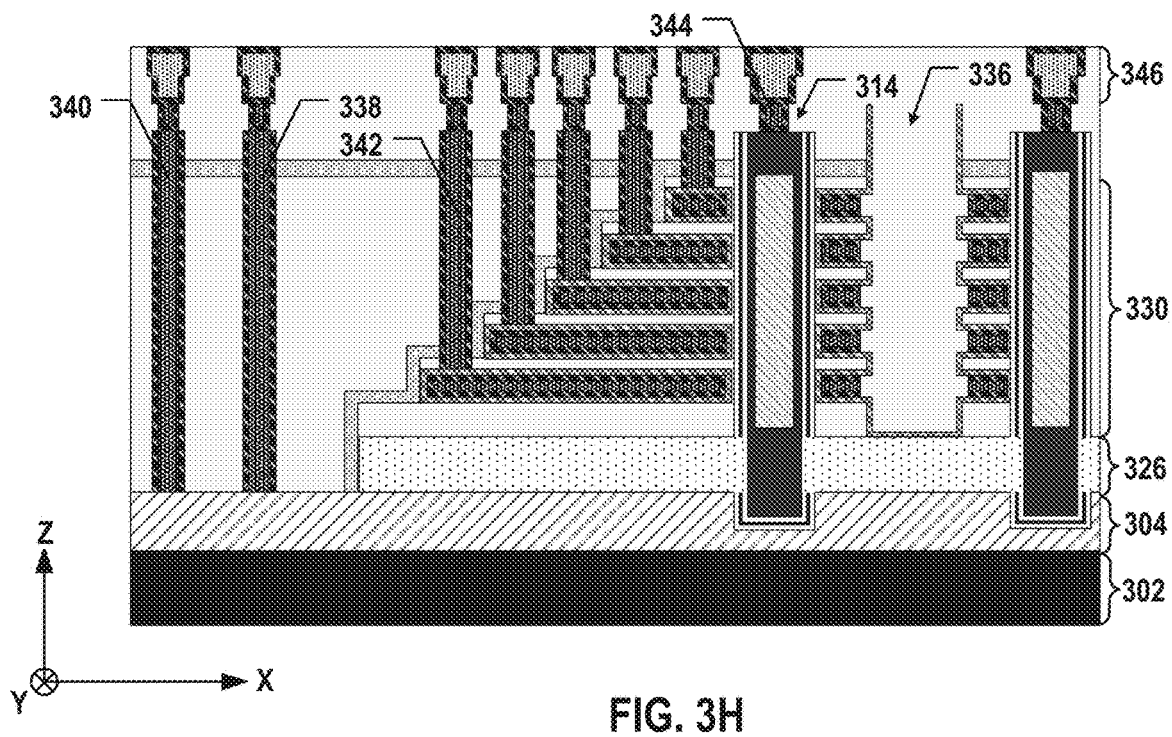
Figure 3I:
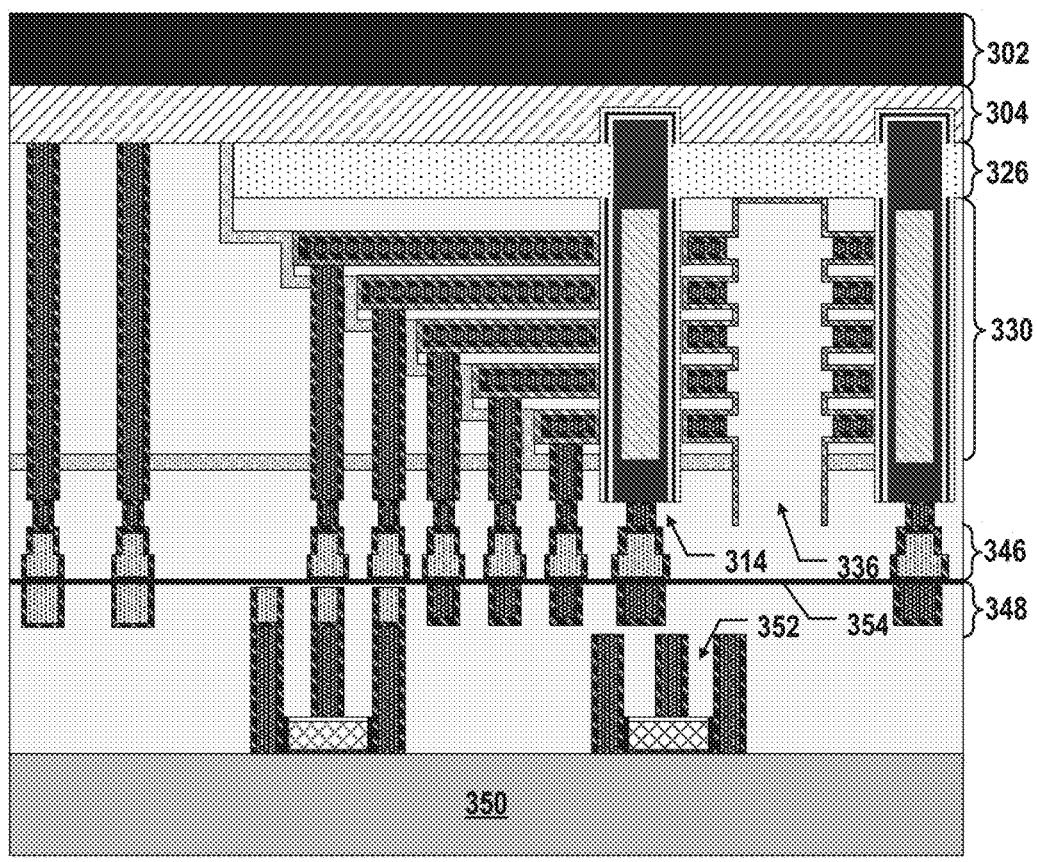

As illustrated in FIG. 3G, after the formation of insulating structure 336, local contacts, including channel local contacts 344 and word line local contacts 342, and peripheral contacts 338 and 340 are formed. A local dielectric layer can be formed on memory stack 330 by depositing dielectric materials, such as silicon oxide or silicon nitride, using one or more thin film deposition processes, such as CVD, PVD, ALD, or any combination thereof, on top of memory stack 330. Channel local contacts 344, word line local contacts 342, and peripheral contacts 338 and 340 can be formed by etching contact openings through the local dielectric layer (and any other ILD layers) using wet etching and/or dry etching, e.g., RIE, followed by filling the contact openings with conductive materials using one or more thin film deposition processes, such as ALD, CVD, PVD, any other suitable processes, or any combination thereof As illustrated in FIG. 3H, a bonding layer 346 is formed above channel local contacts 344, word line local contacts 342, and peripheral contacts 338 and 340. Bonding layer 346 includes bonding contacts electrically connected to channel local contacts 344, word line local contacts 342, and peripheral contacts 338 and 340. To form bonding layer 346, an ILD layer is deposited using one or more thin film deposition processes, such as CVD, PVD, ALD, or any combination thereof, and the bonding contacts are formed through the ILD layer using wet etching and/or dry etching, e.g., RIE, followed by one or more thin film deposition processes, such as ALD, CVD, PVD, any other suitable processes, or any combination thereof Method 400 proceeds to operation 416, as illustrated in FIG. 4B, in which the first substrate and the second substrate are bonded in a face-to-face manner, such that the memory stack is above the peripheral circuit. The bonding can be hybrid bonding. As illustrated in FIG. 3I, silicon substrate 302 and components formed thereon (e.g., memory stack 330 and channel structures 314 formed therethrough) are flipped upside down. Bonding layer 346 facing down is bonded with bonding layer 348 facing up, i.e., in a face-to-face manner, thereby forming a bonding interface 354 between silicon substrates 302 and 350, according to some embodiments. In some embodiments, a treatment process, e.g., a plasma treatment, a wet treatment, and/or a thermal treatment, is applied to the bonding surfaces prior to the bonding. After the bonding, the bonding contacts in bonding layer 346 and the bonding contacts in bonding layer 348 are aligned and in contact with one another, such that memory stack 330 and channel structures 314 formed therethrough can be electrically connected to peripheral circuits 352 and are above peripheral circuits 352.

Figure 3J:
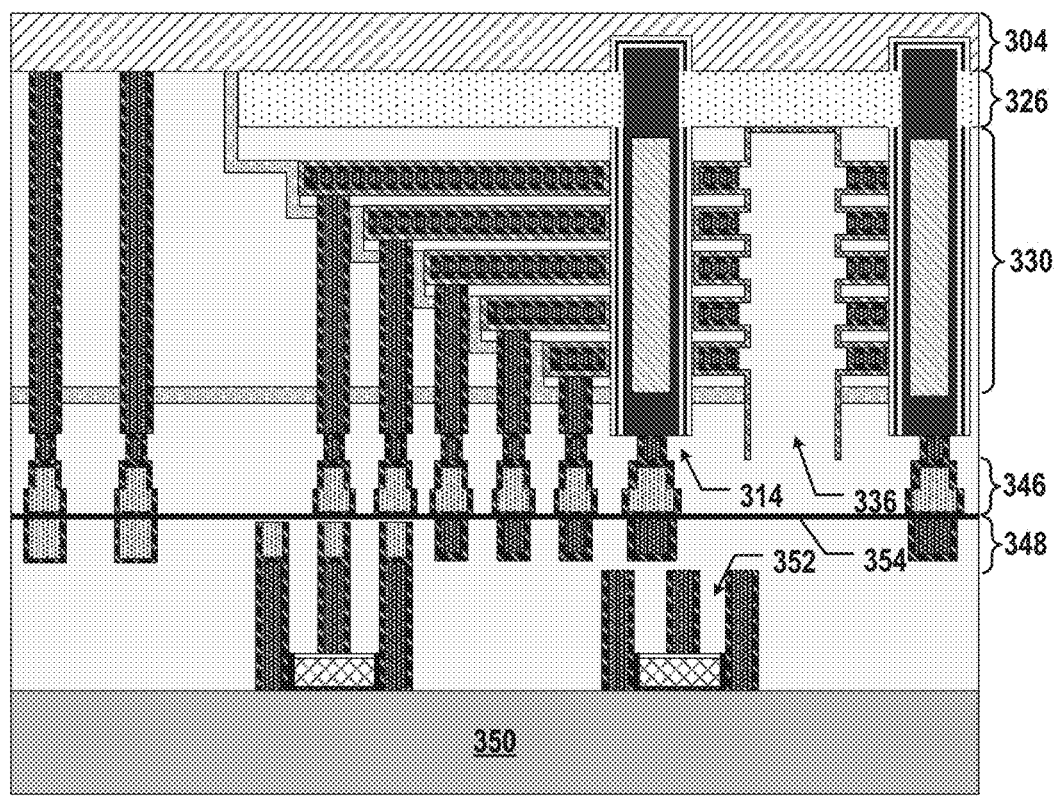

Method 400 proceeds to operation 418, as illustrated in FIG. 4B, in which the second substrate is thinned to expose the second semiconductor layer. The thinning is performed from the second side (e.g., the backside) opposite to the first side of the second substrate. As illustrated in FIG. 3J, silicon substrate 302 (shown in FIG. 3I) is thinned from the backside to expose N-type doped semiconductor layer 304. Silicon substrate 302 can be thinned using CMP, grinding, dry etching, and/or wet etching. In some embodiments, the CMP process is performed to thin silicon substrate 302 until reaching the top surface of N-type doped semiconductor layer 304.

Method 400 proceeds to operation 420, as illustrated in FIG. 4B, in which a source contact is formed above the memory stack and in contact with the second semiconductor layer. In some embodiments, the source contact is formed at the second side (e.g., the backside) opposite to the first side of the second substrate (e.g., the second semiconductor layer after thinning). In some embodiments, the source contact is aligned with the insulating structure.

Figure 3K:
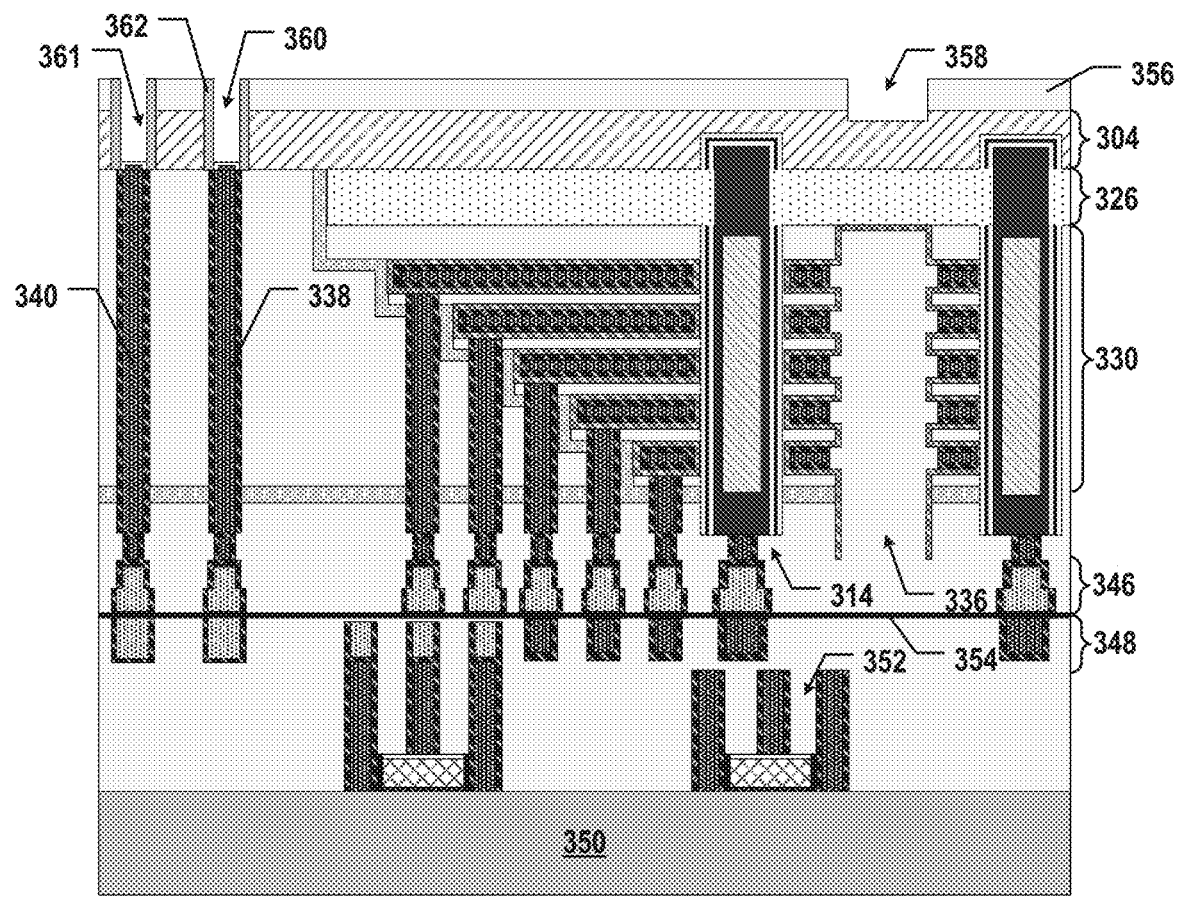
Figure 3K:
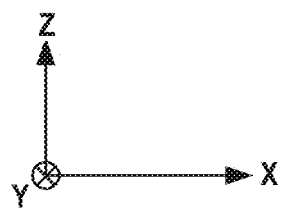

As illustrated in FIG. 3K, one or more ILD layers 356 are formed on N-type doped semiconductor layer 304. ILD layers 356 can be formed by depositing dielectric materials on the top surface of N-type doped semiconductor layer 304 using one or more thin film deposition processes, such as ALD, CVD, PVD, any other suitable processes, or any combination thereof. As illustrated in FIG. 3K, a source contact opening 358 is formed through ILD layers 356 into N-type doped semiconductor layer 304. In some embodiments, source contact opening 358 is formed using wet etching and/or dry etching, such as RIE. In some embodiments, source contact opening 358 extends further into the top portion of N-type doped semiconductor layer 304. The etching process through ILD layers 356 may continue to etch part of N-type doped semiconductor layer 304. In some embodiments, a separate etching process is used to etch part of N-type doped semiconductor layer 304 after etching through ILD layers 356. In some embodiments, source contact opening 358 is patterned using lithography to be aligned with insulating structure 336 at opposite sides of N-type doped semiconductor layer 304.

Figure 3L:
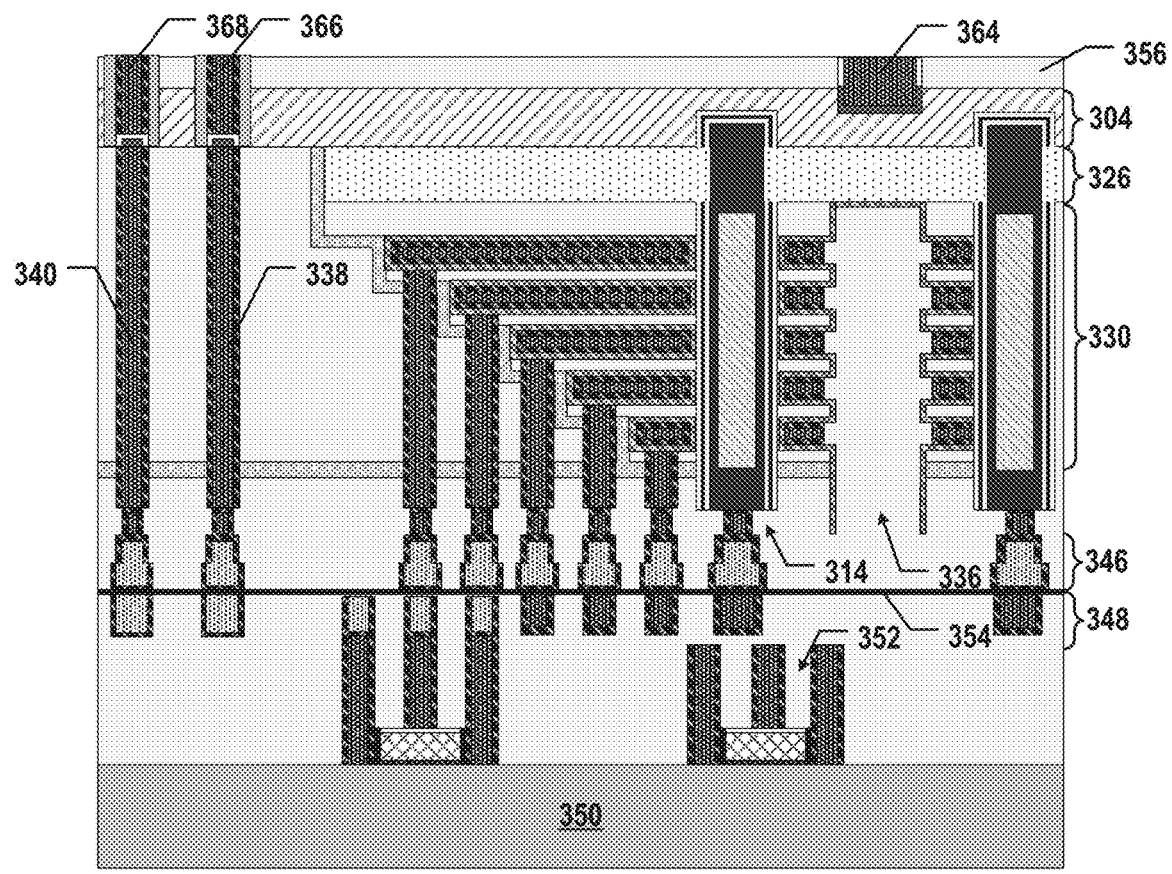

As illustrated in FIG. 3L, a source contact 364 is formed in source contact opening 358 (shown in FIG. 3K) at the backside of N-type doped semiconductor layer 304. Source contact 364 is above memory stack 330 and in contact with N-type doped semiconductor layer 304, according to some embodiments. In some embodiments, one or more conductive materials are deposited into source contact opening 358 using one or more thin film deposition processes, such as ALD, CVD, PVD, any other suitable processes, or any combination thereof, to fill source contact opening 358 with an adhesive layer (e.g., TiN) and a conductor layer (e.g., W). A planarization process, such as CMP, then can be performed to remove the excess conductive materials, such that the top surface of source contact 364 is flush with the top surface of ILD layers 356. In some embodiments, as source contact opening 358 is aligned with insulating structure 336, backside source contact 364 is aligned with insulating structure 336 as well.

Figure 3M:
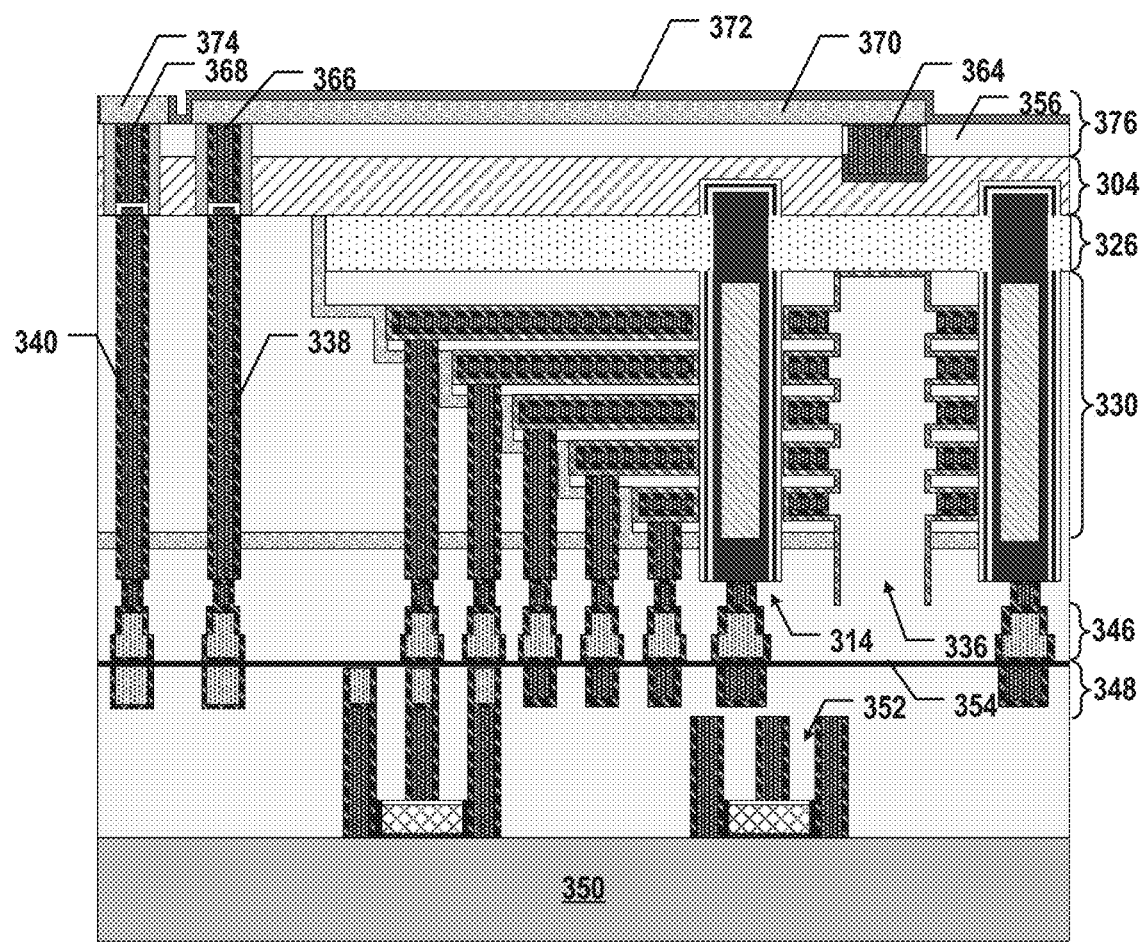
Figure 3M:
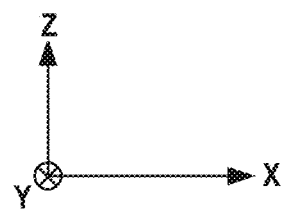

Method 400 proceeds to operation 422, as illustrated in FIG. 4B, in which an interconnect layer is formed above and in contact with the source contact. As illustrated in FIG. 3M, a redistribution layer 370 is formed above and in contact with source contact 364. In some embodiments, redistribution layer 370 is formed by depositing a conductive material, such as Al, on the top surfaces of N-type doped semiconductor layer 304 and source contact 364 using one or more thin film deposition processes, such as ALD, CVD, PVD, any other suitable processes, or any combination thereof. As illustrated in FIG. 3M, a passivation layer 372 is formed on redistribution layer 370. In some embodiments, passivation layer 372 is formed by depositing a dielectric material, such as silicon nitride, using one or more thin film deposition processes, such as ALD, CVD, PVD, any other suitable processes, or any combination thereof. An interconnect layer 376 including ILD layers 356, redistribution layer 370, and passivation layer 372 is thereby formed, according to some embodiments.

Method 400 proceeds to operation 424, as illustrated in FIG. 4B, in which a contact is formed through the second semiconductor layer and in contact with the interconnect layer, such that the first semiconductor layer is electrically connected to the contact through the second semiconductor layer, the source contact, and the interconnect layer. As illustrated in FIG. 3K, contact openings 360 and 361 each extending through ILD layers 356 and N-type doped semiconductor layer 304 are formed. Contact openings 360 and 361 and source contact opening 358 can be formed using the same etching process to reduce the number of etching processes. In some embodiments, contact openings 360 and 361 are formed using wet etching and/or dry etching, such as RIE, through ILD layers 356 and N-type doped semiconductor layer 304. In some embodiments, contact openings 360 and 361 are patterned using lithography to be aligned with peripheral contacts 338 and 340, respectively. The etching of contact openings 360 and 361 can stop at the upper ends of peripheral contacts 338 and 340 to expose peripheral contacts 338 and 340. As illustrated in FIG. 3K, a spacer 362 is formed along the sidewalls of contact openings 360 and 361 to electrically isolate N-type doped semiconductor layer 304 using one or more thin film deposition processes, such as ALD, CVD, PVD, any other suitable processes, or any combination thereof.

As illustrated in FIG. 3L, contacts 366 and 368 are formed in contact openings 360 and 361, respectively (shown in FIG. 3K) at the backside of N-type doped semiconductor layer 304. Contacts 366 and 368 extend vertically through ILD layers 356 and N-type doped semiconductor layer 304, according to some embodiments. Contacts 366 and 368 and source contact 364 can be formed using the same deposition process to reduce the number of deposition processes. In some embodiments, one or more conductive materials are deposited into contact openings 360 and 361 using one or more thin film deposition processes, such as ALD, CVD, PVD, any other suitable processes, or any combination thereof, to fill contact openings 360 and 361 with an adhesive layer (e.g., TiN) and a conductor layer (e.g., W). A planarization process, such as CMP, then can be performed to remove the excess conductive materials, such that the top surfaces of contacts 366 and 368 are flush with the top surface of ILD layers 356. In some embodiments, as contact openings 360 and 361 are aligned with peripheral contacts 338 and 340, respectively, contacts 366 and 368 are above and in contact with peripheral contacts 338 and 340, respectively, as well.

As illustrated in FIG. 3M, redistribution layer 370 is also formed above and in contact with contact 366. As a result, N-type doped semiconductor layer 326 can be electrically connected to peripheral contact 338 through N-type doped semiconductor layer 304, source contact 364, redistribution layer 370 of interconnect layer 376, and contact 366. In some embodiments, N-type doped semiconductor layers 326 and 304 are electrically connected to peripheral circuits 352 through source contact 364, interconnect layer 376, contact 366, peripheral contact 338 and bonding layers 346 and 348.

As illustrated in FIG. 3M, a contact pad 374 is formed above and in contact with contact 368. In some embodiments, part of passivation layer 372 covering contact 368 is removed by wet etching and dry etching to expose part of redistribution layer 370 underneath to form contact pad 374. As a result, contact pad 374 for pad-out can be electrically connected to peripheral circuits 352 through contact 368, peripheral contact 340, and bonding layers 346 and 348.

According to one aspect of the present disclosure, a 3D memory device includes a substrate, a peripheral circuit on the substrate, a memory stack including interleaved conductive layers and dielectric layers above the peripheral circuit, a first semiconductor layer above the memory stack, a second semiconductor layer above and in contact with the first semiconductor layer, a plurality of channel structures each extending vertically through the memory stack and the first semiconductor layer, and a source contact above the memory stack and in contact with the second semiconductor layer.

In some embodiments, each of the first semiconductor layer and the second semiconductor layer includes an N-well.

In some embodiments, the second semiconductor layer includes single crystalline silicon. In some embodiments, the first semiconductor layer includes polysilicon.

In some embodiments, the 3D memory device further includes an interconnect layer above and electrically connected to the source contact.

In some embodiments, the 3D memory device further includes a first contact through the second semiconductor layer. The first semiconductor layer is electrically connected to the peripheral circuit through at least the second semiconductor layer, the source contact, the interconnect layer, and the first contact, according to some embodiments.

In some embodiments, the 3D memory device further includes an insulating structure extending vertically through the memory stack and extending laterally to separate the plurality of channel structures into a plurality of blocks.

In some embodiments, the insulating structure is filled with one or more dielectric materials.

In some embodiments, a top surface of the insulating structure is flush with a bottom surface of the first semiconductor layer.

In some embodiments, the source contact is aligned with the insulating structure.

In some embodiments, each of the channel structures extends vertically into the second semiconductor layer.

In some embodiments, a lateral dimension of the second semiconductor layer is greater than a lateral dimension of the first semiconductor layer.

In some embodiments, the 3D memory device further includes a bonding interface between the peripheral circuit and the memory stack.

In some embodiments, the 3D memory device further includes a second contact through the second semiconductor layer. The interconnect layer includes a contact pad electrically connected to the second contact, according to some embodiments.

According to another aspect of the present disclosure, a 3D memory device includes a substrate, a memory stack including interleaved conductive layers and dielectric layers above the substrate, an N-type doped semiconductor layer above the memory stack, a plurality of channel structures each extending vertically through the memory stack into the N-type doped semiconductor layer, and a source contact above the memory stack and in contact with the N-type doped semiconductor layer.

In some embodiments, the 3D memory device further includes an insulating structure extending vertically through the memory stack and extending laterally to separate the plurality of channel structures into a plurality of blocks.

In some embodiments, the insulating structure is filled with one or more dielectric materials.

In some embodiments, a top surface of the insulating structure is flush with a bottom surface of the N-type doped semiconductor layer.

In some embodiments, the source contact is aligned with the insulating structure.

In some embodiments, the N-type doped semiconductor layer includes a first N-type doped semiconductor layer including polysilicon and a second N-type doped semiconductor layer including single crystalline silicon.

In some embodiments, each of the channel structures extends vertically through the first N-type doped semiconductor layer.

In some embodiments, the source contact is above the first N-type doped semiconductor layer and is in contact with the second N-type doped semiconductor layer.

In some embodiments, a lateral dimension of the second N-type doped semiconductor layer is greater than a lateral dimension of the first N-type doped semiconductor layer.

In some embodiments, the 3D memory device further includes a peripheral circuit on the substrate, and a bonding interface between the peripheral circuit and the memory stack.

In some embodiments, the 3D memory device further includes an interconnect layer above and electrically connected to the source contact.

In some embodiments, the N-type doped semiconductor layer is electrically connected to the peripheral circuit through at least the source contact and the interconnect layer.

According to still another aspect of the present disclosure, a 3D memory device includes a first semiconductor structure, a second semiconductor structure, and a bonding interface between the first semiconductor structure and the second semiconductor structure. The first semiconductor structure includes a peripheral circuit. The second semiconductor structure includes a memory stack including interleaved conductive layers and dielectric layers, an N-type doped semiconductor layer, a plurality of channel structures each extending vertically through the memory stack into the N-type doped semiconductor layer and electrically connected to the peripheral circuit, and an insulating structure extending vertically through the memory stack and extending laterally to separate the plurality of channel structures into a plurality of blocks.

In some embodiments, the second semiconductor structure further includes a source contact in contact with the N-type doped semiconductor layer and aligned with the insulating structure.

In some embodiments, the second semiconductor structure further includes an interconnect layer, and the N-type doped semiconductor layer is electrically connected to the peripheral circuit through at least the source contact and the interconnect layer.

In some embodiments, the insulating structure is filled with one or more dielectric materials.

In some embodiments, the insulating structure does not extend vertically into the N-type doped semiconductor layer.

In some embodiments, the N-type doped semiconductor layer includes a first N-type doped semiconductor layer including polysilicon and a second N-type doped semiconductor layer including single crystalline silicon.

In some embodiments, each of the channel structures extends vertically through the first N-type doped semiconductor layer.

In some embodiments, the source contact is in contact with the second N-type doped semiconductor layer.

In some embodiments, a lateral dimension of the second N-type doped semiconductor layer is greater than a lateral dimension of the first N-type doped semiconductor layer.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
    a memory stack comprising interleaved conductive layers and dielectric layers;
    a plurality of semiconductor layers contacted with each other and located adjacent to the memory stack;
    a plurality of channel structures each extending vertically through the memory stack and at least one of the semiconductor layers; and
    a source contact in contact with one side of the semiconductor layers away from the memory stack.

2. The 3D memory device of claim 1, further comprising:
    a contact pad located on the one side of the semiconductor layers away from the memory stack and electrically connected to a first through contact penetrating the at least one of the semiconductor layers.

3. The 3D memory device of claim 1, wherein dopant concentrations of the semiconductor layers are different.

4. The 3D memory device of claim 1, wherein each of the semiconductor layers is N-type doped and comprises an N-well.

5. The 3D memory device of claim 1, wherein the semiconductor layers comprise:
    a first semiconductor layer located adjacent to the memory stack and having a first lateral dimension; and a second semiconductor layer located away from the memory stack and having a second lateral dimension greater than the first lateral dimension.

6. The 3D memory device of claim 5, wherein one end of the source contact and one end of each of the channel structures are embedded in the second semiconductor layer.

7. The 3D memory device of claim 5, wherein:
each of the channel structures comprises a memory film and a semiconductor channel;
at least a portion of the semiconductor channel is surrounded by the memory film in a lateral direction;
the first semiconductor layer is in contact with a sidewall of a semiconductor channel;
one end of the semiconductor channel in a vertical direction is covered by the memory film; and
the second semiconductor layer is in contact with the memory film.

8. The 3D memory device of claim 5, further comprising an insulating structure extending vertically through the memory stack and extending laterally to divide the channel structures.

9. The 3D memory device of claim 8, wherein the insulating structure is aligned with the source contact in a vertical direction.

10. The 3D memory device of claim 8, wherein the insulating structure is in contact with the first semiconductor layer.

11. The 3D memory device of claim 8, wherein a top surface of one end of the insulating structure is flush with a bottom surface of the first semiconductor layer.

12. The 3D memory device of claim 5, further comprising:
a peripheral circuit on a substrate; and
a bonding interface between the peripheral circuit and the memory stack.

13. The 3D memory device of claim 12, further comprising:
an interconnect layer electrically connected to the source contact; and
a second through contact penetrating the second semiconductor layer;
wherein the first semiconductor layer is electrically connected to the peripheral circuit through at least the second semiconductor layer, the source contact, the interconnect layer, and the second through contact.

14. The 3D memory device of claim 5, wherein:
the first semiconductor layer comprises polycrystalline silicon; and
the second semiconductor layer comprises monocrystalline silicon.

15. A three-dimensional (3D) memory device, comprising:
a first semiconductor structure comprising a peripheral circuit;
a second semiconductor structure comprising:
a memory stack comprising interleaved conductive layers and dielectric layers,
a plurality of semiconductor layers contacted with each other and located adjacent to the memory stack,
a plurality of channel structures each extending vertically through the memory stack and at least one of the semiconductor layers, and
a source contact in contact with one side of the semiconductor layers away from the memory stack; and
a bonding interface between the first semiconductor structure and the second semiconductor structure and located on one side of the memory stack away from the plurality of semiconductor layers.

16. The 3D memory device of claim 15, wherein:
each of the semiconductor layers is N-type doped and comprises an N-well; and
dopant concentrations of the semiconductor layers are different.

17. The 3D memory device of claim 15, wherein:
a first semiconductor layer located adjacent to the memory stack and having a first lateral dimension; and
a second semiconductor layer located away from the memory stack and having a second lateral dimension greater than the first lateral dimension.

18. The 3D memory device of claim 17, wherein:
each of the channel structures comprises a memory film and a semiconductor channel;
at least a portion of the semiconductor channel is surrounded by the memory film in a lateral direction;
the first semiconductor layer is in contact with a sidewall of a semiconductor channel;
one end of the semiconductor channel in a vertical direction is covered by the memory film; and
the second semiconductor layer is in contact with the memory film.

19. The 3D memory device of claim 17, wherein the second semiconductor structure further comprises:
an insulating structure extending vertically through the memory stack and extending laterally to divide the channel structures;
wherein the insulating structure is aligned with the source contact in a vertical direction, and a top surface of one end of the insulating structure is in contact with and flush with a bottom surface of the first semiconductor layer.

20. The 3D memory device of claim 17, further comprising:
an interconnect layer electrically connected to the source contact;
a second through contact penetrating the second semiconductor layer, wherein the interconnect layer comprises a contact pad electrically connected to the second through contact, wherein the contact pad is located on one side of the second semiconductor layer away from the first semiconductor layer; and
a first through contact penetrating the second semiconductor layer, wherein the first semiconductor layer is electrically connected to the peripheral circuit through at least the second semiconductor layer, the source contact, the interconnect layer, and the first through contact.

* * * * *